United States Patent
Senoo et al.

(10) Patent No.: US 9,601,592 B2
(45) Date of Patent: Mar. 21, 2017

(54) IGBT AND METHOD OF MANUFACTURING THE SAME

(71) Applicant: TOYOTA JIDOSHA KABUSHIKI KAISHA, Toyota-shi, Aichi-ken (JP)

(72) Inventors: Masaru Senoo, Okazaki (JP); Kyosuke Miyagi, Miyoshi (JP); Tsuyoshi Nishiwaki, Nagakute (JP); Jun Saito, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/884,203

(22) Filed: Oct. 15, 2015

(65) Prior Publication Data
US 2016/0035859 A1  Feb. 4, 2016

Related U.S. Application Data

(62) Division of application No. 14/347,897, filed as application No. PCT/JP2011/072274 on Sep. 28, 2011, now Pat. No. 9,190,503.

(51) Int. Cl.
*H01L 21/332* (2006.01)
*H01L 29/66* (2006.01)
(Continued)

(52) U.S. Cl.
CPC .... *H01L 29/66348* (2013.01); *H01L 29/0696* (2013.01); *H01L 29/0834* (2013.01);
(Continued)

(58) Field of Classification Search
CPC .............. H01L 29/0696; H01L 29/0834; H01L 29/1095; H01L 29/36; H01L 29/6634; H01L 29/66348; H01L 29/7396; H01L 29/7397
(Continued)

(56) References Cited

U.S. PATENT DOCUMENTS 5,751,024 A  *  5/1998  Takahashi  ........... H01L 29/7397
                                                                        257/139
6,172,398 B1      1/2001  Hshieh
(Continued)

FOREIGN PATENT DOCUMENTS

JP     H08-316479 A    11/1996
JP     H11-251573 A     9/1999
(Continued)

OTHER PUBLICATIONS

"Maxima and minima—Wikipedia, the free encyclopedia", Dec. 31, 2014 (Dec. 31, 2014).
(Continued)

*Primary Examiner* — Mohammed Shamsuzzaman
(74) *Attorney, Agent, or Firm* — Oliff PLC

(57) ABSTRACT

An IGBT has an emitter region, a top body region that is formed below the emitter region, a floating region that is formed below the top body region, a bottom body region that is formed below the floating region, a trench, a gate insulating film that covers an inner face of the trench, and a gate electrode that is arranged inside the trench. When a distribution of a concentration of p-type impurities in the top body region and the floating region, which are located below the emitter region, is viewed along a thickness direction of a semiconductor substrate, the concentration of the p-type impurities decreases as a downward distance increases from an upper end of the top body region that is located below the emitter region, and assumes a local minimum value at a predetermined depth in the floating region.

6 Claims, 24 Drawing Sheets

(51) Int. Cl.
*H01L 29/36* (2006.01)
*H01L 29/739* (2006.01)
*H01L 29/06* (2006.01)
*H01L 29/08* (2006.01)
*H01L 29/10* (2006.01)

(52) U.S. Cl.
CPC .......... *H01L 29/1095* (2013.01); *H01L 29/36* (2013.01); *H01L 29/6634* (2013.01); *H01L 29/7396* (2013.01); *H01L 29/7397* (2013.01)

(58) Field of Classification Search
USPC ... 257/53, 139, 586, 470, 133; 438/529, 138
See application file for complete search history.

(56) References Cited

U.S. PATENT DOCUMENTS

| | | | | |
|---|---|---|---|---|
| 2008/0006906 A1* | 1/2008 | Hatade | ................ | H01L 29/0696 257/586 |
| 2008/0012040 A1* | 1/2008 | Saito | .................. | H01L 29/0696 257/133 |
| 2008/0197379 A1 | 8/2008 | Aono et al. | | |
| 2008/0315301 A1* | 12/2008 | Takemori | ............ | H01L 29/1095 257/331 |
| 2009/0230500 A1* | 9/2009 | Yoshikawa | ......... | H01L 27/0255 257/470 |
| 2010/0181596 A1* | 7/2010 | Suzuki | ................ | H01L 29/0834 257/139 |
| 2010/0327313 A1* | 12/2010 | Nakamura | .......... | H01L 29/0834 257/133 |
| 2011/0193132 A1* | 8/2011 | Kouno | ................ | H01L 29/0619 257/139 |
| 2011/0201187 A1* | 8/2011 | Nishiwaki | ........... | H01L 29/0834 438/529 |
| 2012/0146091 A1* | 6/2012 | Tanabe | ................ | H01L 29/0696 257/139 |
| 2014/0299915 A1* | 10/2014 | Kouno | .................. | H01L 21/263 257/139 |

FOREIGN PATENT DOCUMENTS

| | | |
|---|---|---|
| JP | 2001-044415 A | 2/2001 |
| JP | 2008-205015 A | 9/2008 |
| JP | 2008-205205 A | 9/2008 |
| JP | 2010/103326 A | 5/2010 |

OTHER PUBLICATIONS

Feb. 11, 2015 Office Action issued in U.S. Appl. No. 14/347,897.
Jul. 14, 2015 Notice of Allowance issued in U.S. Appl. No. 14/347,897.

* cited by examiner

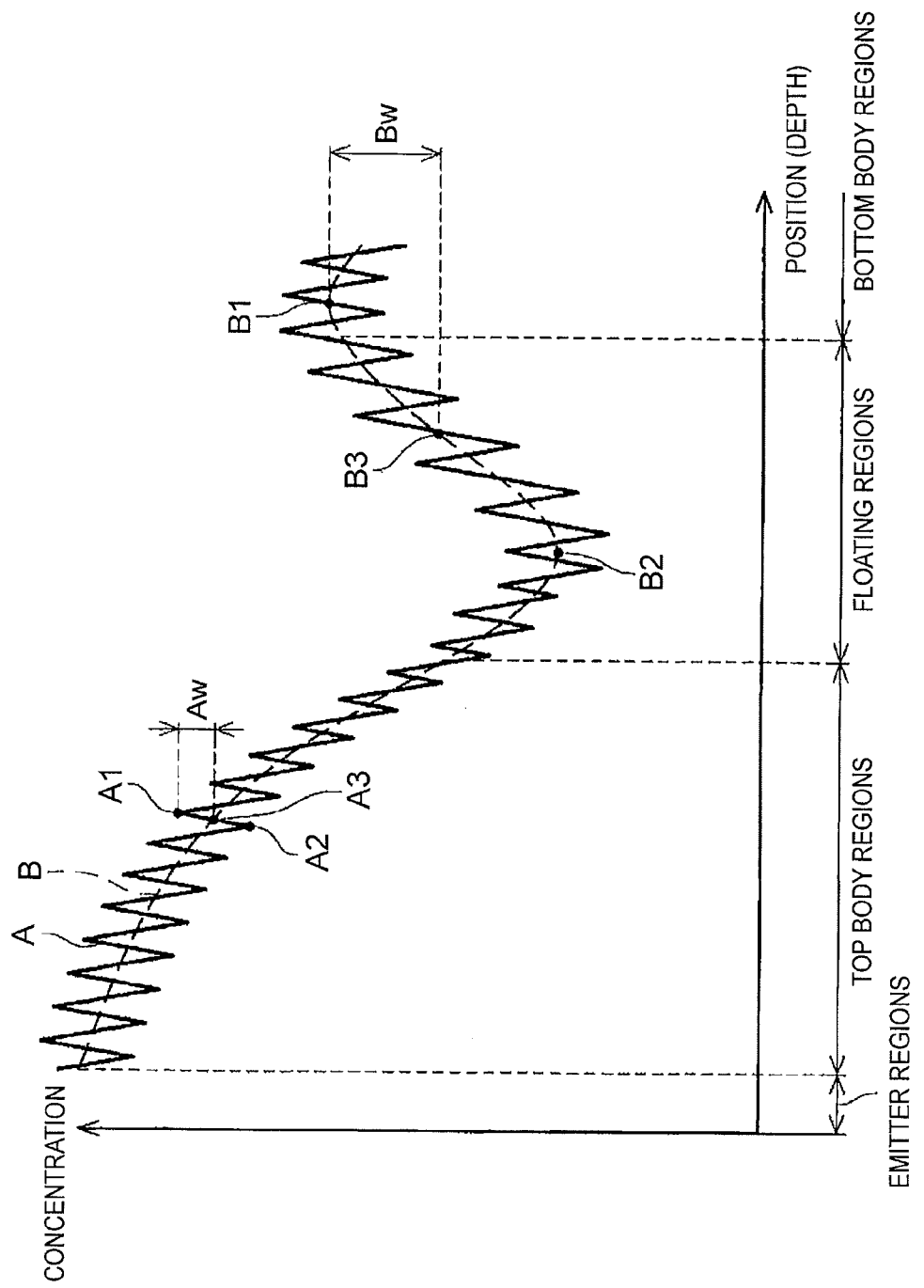

IGBT AND METHOD OF MANUFACTURING THE SAME

This is a Divisional application of application Ser. No. 14/347,897 filed Mar. 27, 2014 which is a National Phase of PCT/JP2011/072274 filed Sep. 28, 2011. The disclosures of the prior applications are hereby incorporated by reference herein in their entirety.

TECHNICAL FIELD

The art disclosed in the present specification relates to an IGBT.

BACKGROUND ART

In Japanese Patent Application Publication No. 2010-103326 (JP-2010-103326 A) (hereinafter referred to as Patent Document 1), there is disclosed an IGBT that has a top body region, a floating region, and a bottom body region. In manufacturing this IGBT, after a trench gate electrode is formed, p-type impurities are implanted in such a manner as to stop within a depth range of the top body region, n-type impurities are implanted in such a manner as to stop within a depth range of the floating region, and p-type impurities are implanted in such a manner as to stop within a depth range of the bottom body region. Thus, the top body region, the floating region, and the bottom body region are formed.

SUMMARY OF THE INVENTION

Problem to be Solved by the Invention

In a manufacturing method of Patent Document 1, the respective impurities are implanted after the trench gate electrode is formed. If the impurities are thus implanted into the respective regions after the trench gate electrode is formed, it becomes difficult to accurately control the implantation depth of impurities into a region in the vicinity of the trench gate electrode, due to the influence of the shape of a recess portion that exists in an upper portion of the trench gate electrode. The art of Patent Document 1 explains that the implantation depth of impurities into the region in the vicinity of the trench gate electrode is stabilized by setting the depth of the recess portion to a predetermined value. In this method as well, however, the implantation depth is dispersed to a certain extent. The ON-state voltage and the gate threshold voltage are dispersed among mass-produced IGBT's, due to this dispersion of the implantation depth.

In order to prevent the implantation depth of impurities in the vicinity of the trench gate electrode from being dispersed, it is also conceivable to form the trench gate electrode after implanting the impurities. However, in a method in which the impurities are directly implanted into the respective regions as in Patent Document 1, the respective impurities need to be implanted to a deep position through high energy, so that a semiconductor substrate is seriously damaged. If the trench gate electrode is formed on the semiconductor substrate thus damaged, an oxidation-induced defect (hereinafter referred to as an OSF) is caused in the semiconductor substrate, in a heat treatment for forming a gate insulating film. Since a leak current is produced in the semiconductor substrate with the OSF formed therein, it is difficult to adopt this method.

Accordingly, the present specification provides an art that can restrain an ON-state voltage and a gate threshold voltage from being dispersed among mass-produced IGBT's.

Means for Solving the Problem

An IGBT that is provided by the present specification is equipped with a semiconductor substrate. The IGBT has an emitter region, a top body region, a floating region, a bottom body region, a trench, a gate insulating film, and a gate electrode. The emitter region is an n-type region that is formed in such a range as to be exposed to an upper face of the semiconductor substrate. The top body region is a p-type region that is formed below the emitter region. The floating region is an n-type region that is formed below the top body region and separated from the emitter region by the top body region. The bottom body region is a p-type region that is formed below the floating region and separated from the top body region by the floating region. The trench is formed in the upper face of the semiconductor substrate, and penetrates the emitter region, the top body region, the floating region, and the bottom body region. The gate insulating film covers an inner face of the trench. The gate electrode is arranged inside the trench. When a distribution of a concentration of p-type impurities in the top body region and the floating region, which are located below the emitter region, is viewed along a thickness direction of the semiconductor substrate, the concentration of p-type impurities decreases as a downward distance increases from an upper end of the top body region that is located below the emitter region, and assumes a local minimum value at a predetermined depth in the floating region.

Incidentally, the top body region may be formed not only below the emitter region but also beside the emitter region. Besides, the aforementioned "such a range as to be exposed to the upper face of the semiconductor substrate" means a range that emerges on the upper face of the semiconductor substrate in the case where the electrode and the insulating film, which are formed on the semiconductor substrate, are removed. Accordingly, even a region whose surface is covered with the electrode and the insulating film may fall under "such a range as to be exposed to the upper face of the semiconductor substrate". Besides, in describing the distribution of the concentration of impurities in the semiconductor substrate in the present specification, a waveform with an amplitude that is smaller than 30% of the concentration of the impurities is a noise resulting from a measurement error, and is not treated as a local maximum value or a local minimum value. For example, in the case where a distribution of the concentration of p-type impurities in the top body region and the floating region as shown in a graph A of FIG. 41 is obtained, a plus peak value A1 and a minus peak value A2 are not treated as a local maximum value and a local minimum value respectively. This is because an amplitude Aw (=(A1−A2)/2) of a waveform including the values A1 and A2 is smaller than 30% of an average A3 of the value A1 and the value A2. If such a small waveform is ignored, the graph A can be regarded as a graph B. Besides, a plus peak value B1 of the graph B is treated as a local maximum value, and a minus peak value B2 of the graph B is treated as a local minimum value. This is because an amplitude Bw (=(B1−B2)/2) of a waveform including the values B1 and B2 is larger than 30% of an average B3 of the value B1 and the value B2. Accordingly, the graph A shown in FIG. 41 has a configuration in which "the concentration of p-type impurities decreases as the downward distance increases from the upper end of the top body region that is located below the emitter region, and assumes the local minimum value at the predetermined depth in the floating region". Incidentally, FIG. 41 is exemplified for the sake of illustration, and does not limit the claims. For example, the plus peak value B1 may not exist in the bottom body region.

In this manner, the top body region in which the concentration of p-type impurities is distributed in such a manner as to decrease as the downward distance increases can be formed by implanting p-type impurities into the vicinity of the upper face of the semiconductor substrate (within a depth range of the emitter region) and diffusing the implanted p-type impurities. In this method, the top body region is formed by diffusing the p-type impurities implanted at a shallow position. Therefore, even if the top body region is formed after a trench gate electrode (a set of the gate insulating film and the gate electrode arranged in the trench) is formed, the distribution of the concentration of p-type impurities in the top body region is hardly influenced by the shape of the trench gate electrode. Besides, in this method, the trench gate electrode can also be formed after the top body region is formed. In this case as well, almost no OSF is produced in and around the top body region. This is because p-type impurities are implanted into the vicinity of the upper face of the semiconductor substrate, and hence there is no peak of the p-type impurities in the top body region, and the top body region is hardly damaged. In this manner, this top body region can be stably formed both before the trench gate electrode is formed and after the trench gate electrode is formed. The distribution of the concentration of p-type impurities in the top body region has a great influence on the gate threshold voltage of the IGBT. Accordingly, in the case where these IGBT's are mass-produced, the gate threshold voltage is unlikely to be dispersed among the mass-produced IGBT's. Besides, the floating region having a local minimum value of the concentration of p-type impurities can be realized by implanting p-type impurities into a region that is located below the floating region (e.g., the bottom body region). By thus providing the floating region with a local minimum value of the concentration of p-type impurities, the difference between the concentration of n-type impurities and the concentration of p-type impurities increases, and hence the floating region can be stably formed. The concentration of impurities in the floating region influences the ON-state voltage of the IGBT. Accordingly, in the case where these IGBT's are mass-produced, the ON-state voltage is unlikely to be dispersed among the mass-produced IGBT's. Besides, p-type impurities are implanted into the region that is located below the aforementioned floating region with high energy. Therefore, this implantation needs to be carried out after the trench gate electrode is formed. If p-type impurities are implanted to a deep position after the trench gate electrode is formed, the implantation depth of impurities is unstable in the vicinity of the trench gate electrode, as described above. Accordingly, it is difficult to control the concentration of impurities in the region that is located below the floating region (e.g., the bottom body region).

However, the inventors have discovered that the distribution of the concentration of impurities in the vicinity of the trench gate electrode that is located below the floating region does not have a great influence on the characteristics of the IGBT's (the ON-state voltage, the gate threshold voltage and the like). Accordingly, the characteristics of the IGBT's are hardly dispersed as a result of the dispersion of the distribution of the concentration of impurities in the region that is located below the floating region. Accordingly, when these IGBT's are mass-produced, the ON-state voltage and the gate threshold voltage are unlikely to be dispersed among the IGBT's.

In the aforementioned IGBT, it is preferable that when a distribution of a concentration of n-type impurities in the floating region is viewed along the thickness direction of the semiconductor substrate, a local maximum value of the concentration of the n-type impurities do not exist in the floating region.

This floating region can be formed by implanting n-type impurities into the vicinity of the upper face of the semiconductor substrate (within the depth range of the emitter region) and diffusing the implanted n-type impurities. Alternatively, such a floating region can also be formed through epitaxial growth. These methods make it possible to control the concentration of n-type impurities in the floating region without being influenced by the shape of the trench gate electrode. Accordingly, when these IGBT's are mass-produced, the ON-state voltage is more unlikely to be dispersed among the IGBT's.

In the aforementioned IGBT, it is preferable that the floating region be formed by an epitaxial layer.

This configuration makes it possible to hold the concentration of n-type impurities in the floating region substantially constant. Accordingly, the concentration of n-type impurities in the floating region can be more accurately controlled. Accordingly, when these IGBT's are mass-produced, the ON-state voltage is more unlikely to be dispersed among the IGBT's.

In the aforementioned IGBT, it is preferable that when a distribution of a concentration of p-type impurities in the bottom body region is viewed along the thickness direction of the semiconductor substrate, a local maximum value of the concentration of the p-type impurities exist in the bottom body region.

In the case where the local maximum value of the concentration of p-type impurities thus exists in the bottom body region, when the IGBT's are mass-produced, the position of the lower end of the floating region is unlikely to be dispersed among the IGBT's. Accordingly, when these IGBT's are mass-produced, the ON-state voltage is more unlikely to be dispersed among the IGBT's.

In the aforementioned IGBT, it is preferable that a width of the floating region along the thickness direction of the semiconductor substrate be wider at a position in contact with the gate insulating film than at a position away from the gate insulating film In this manner, if the width of the floating region is wide in the vicinity of the gate insulating film where holes are likely to flow, a larger number of holes can be accumulated in the region that is located below the floating region (e.g., a drift region) when the IGBT is on. Accordingly, this configuration makes it possible to reduce the ON-state voltage of the IGBT.

In the aforementioned IGBT, it is preferable that a lower end of the bottom body region be located lower at a position in contact with the gate insulating film than at a position away from the gate insulating film This configuration makes it possible to reduce the feedback capacity of the IGBT.

Besides, the present specification provides a new method of manufacturing an IGBT. This manufacturing method has a process of forming an n-type emitter region in such a range as to be exposed to an upper face of a semiconductor substrate, a process of forming a p-type top body region below a depth range of the emitter region by implanting p-type impurities into the upper face of the semiconductor substrate such that the p-type impurities stop within the depth range of the emitter region, and diffusing the implanted p-type impurities, a process of forming an n-type floating region below a depth range of the top body region by implanting n-type impurities into the upper face of the semiconductor substrate such that the n-type impurities stop within the depth range of the emitter region, and diffusing the implanted n-type impurities, a process of forming a trench in the upper face of the semiconductor substrate, and forming a gate insulating film that covers an inner face of the trench, and a gate electrode that is arranged in the trench, and a process of forming a p-type bottom body region below a depth range of the floating region by implanting p-type impurities into the upper face of the semiconductor substrate such that the p-type impurities stop at a depth below the depth range of the floating region, after forming the trench, the gate insulating film, and the gate electrode. The trench is arranged in such a manner as to penetrate the emitter region, the top body region, the floating region, and the bottom body region after the respective processes are carried out.

Incidentally, the process of forming the emitter region, the process of forming the top body region, the process of forming the floating region, and the process of forming the trench, the gate insulating film, and the gate electrode may be carried out in any sequence. Accordingly, the aforementioned "depth range of the emitter region" may be the depth range of the emitter region that has already been formed or the depth range of the emitter region that is to be formed. By the same token, each of "the depth range of the top body region" and "the depth range of the floating region" may be the depth range of the region that has already been formed or the depth range of the region that is to be formed. Besides, in the present specification, the implantation of impurities in such a manner that the impurities stop in the predetermined depth range means that the average stop position of the implanted impurities is in the predetermined depth range.

This method makes it possible to stably form the top body region and the floating region through diffusion of the impurities. Besides, the bottom body region is formed by implanting p-type impurities to the deep position after the trench gate electrode is formed. Therefore, the bottom body region can be formed without substantially raising the p-type impurities in the floating region. Accordingly, if the IGBT's are mass-produced according to this manufacturing method, the ON-state voltage and the gate threshold voltage are restrained from being dispersed among the mass-produced IGBT's.

In the aforementioned manufacturing method, it is preferable that the process of forming the top body region and the process of forming the floating region be carried out prior to the process of forming the trench, the gate insulating film, and the gate electrode.

According to this manufacturing method, the width of the floating region in the vicinity of the gate insulating film is widened when the gate insulating film is formed. Accordingly, this manufacturing method makes it possible to manufacture an IGBT with a lower ON-state voltage.

In the aforementioned manufacturing method, it is preferable that the p-type impurities be implanted into the semiconductor substrate with an upper face of the gate electrode present below the upper face of the semiconductor substrate, in the process of forming the bottom body region.

This manufacturing method makes it possible to form the bottom body region such that the lower end thereof is located lower at the position in contact with the gate insulating film than at the position away from the gate insulating film. Accordingly, the feedback capacity of the IGBT can be reduced.

Besides, the present specification provides another manufacturing method. This method of manufacturing an IGBT has a process of causing an epitaxial layer of an n-type semiconductor to grow on an upper face of a base substrate, a process of forming an n-type emitter region in such a range as to be exposed to an upper face of the epitaxial layer, a process of forming a p-type top body region below a depth range of the emitter region by implanting p-type impurities into the upper face of the epitaxial layer such that the p-type impurities stop within the depth range of the emitter region, and diffusing the implanted p-type impurities, a process of forming a trench in the upper face of the epitaxial layer, and forming a gate insulating film that covers an inner face of the trench, and a gate electrode that is arranged in the trench, and a process of forming a p-type bottom body region in the base substrate by implanting p-type impurities into the upper face of the epitaxial layer such that the p-type impurities stop in the base substrate, after forming the trench, the gate insulating film, and the gate electrode. The n-type epitaxial layer remains between the top body region and the bottom body region to constitute the floating region, and the trench is arranged in such a manner as to penetrate the emitter region, the top body region, the floating region, and the bottom body region, after the aforementioned respective processes are carried out.

This manufacturing method makes it possible to stably form the top body region and the floating region through epitaxial growth and diffusion of impurities. Accordingly, if the IGBT's are mass-produced according to this manufacturing method, the ON-state voltage and the gate threshold voltage are restrained from being dispersed among the IGBT's. Besides, in this manufacturing method, the floating region is constituted by the n-type epitaxial layer. Accordingly, the concentration of n-type impurities in the floating region can be held substantially constant. Accordingly, in the case where these IGBT's are mass-produced, the ON-state voltage is more unlikely to be dispersed among the IGBT's.

In the aforementioned manufacturing method for causing the epitaxial layer to grow, it is preferable that the process of forming the top body region be carried out prior to the process of forming the trench, the gate insulating film, and the gate electrode.

According to this manufacturing method, the width of the n-type epitaxial layer in the vicinity of the gate insulating film (i.e., the floating region) is widened when the gate insulating film is formed. Accordingly, this manufacturing method makes it possible to manufacture an IGBT with a lower ON-state voltage.

In the aforementioned manufacturing method for causing the epitaxial layer to grow, it is preferable that the p-type impurities be implanted into a semiconductor substrate with an upper face of the gate electrode present below an upper face of the semiconductor substrate, in the process of forming the bottom body region.

This manufacturing method makes it possible to form the bottom body region such that the lower end thereof is located lower at the position in contact with the gate insulating film than at the position away from the gate insulating film. Accordingly, the feedback capacity of the IGBT can be reduced.

BRIEF DESCRIPTION OF THE DRAWINGS

FIG. 41 is a graph illustrating local maximum values and local minimum values in the distribution of concentrations of impurities.

MODES FOR CARRYING OUT THE INVENTION (First Embodiment)

Figure 1:
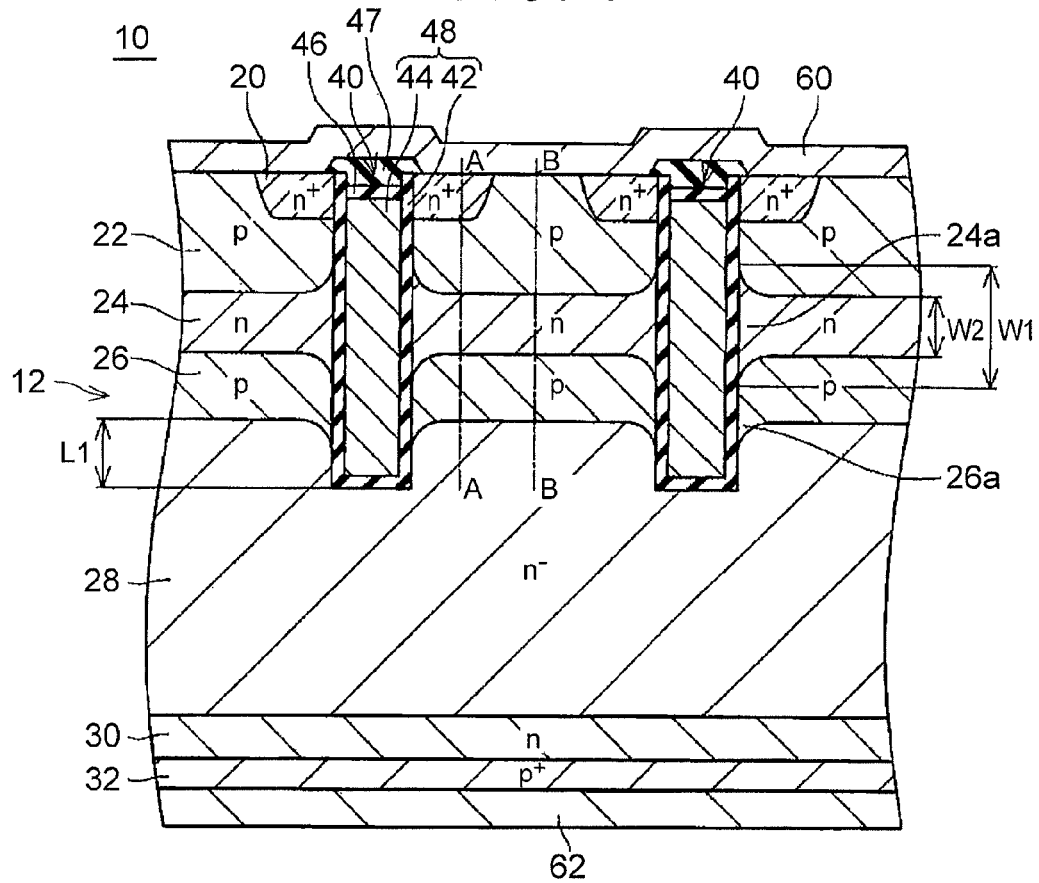
FIG. 1 is a longitudinal sectional view of an IGBT 10 according to the first embodiment of the invention.

The IGBT 10 shown in FIG. 1 is constituted of a semiconductor substrate 12, and electrodes, insulating films and the like that are formed on an upper face and a lower face of the semiconductor substrate 12.

Figure 2:
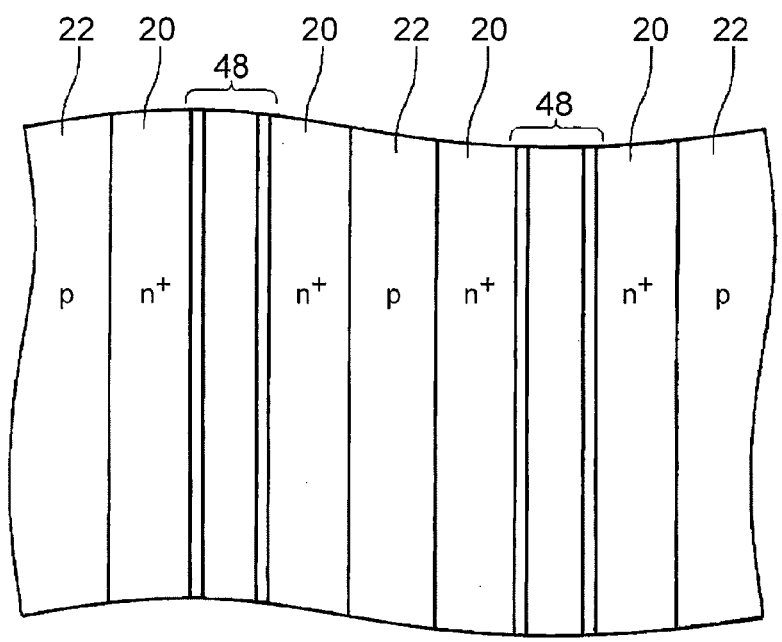
FIG. 2 is a top view of the IGBT 10 with an emitter electrode 60, cap insulating films 46, and interlayer insulating films 47 not shown.

A plurality of trenches 40 are formed in the upper face of the semiconductor substrate 12. An inner face of each of the trenches 40 is covered with a corresponding one of gate insulating films 42. Each of gate electrodes 44 is formed inside a corresponding one of the trenches 40. An upper face of each of the gate electrodes 44 is covered with a corresponding one of cap insulating films 46. Besides, each of interlayer insulating films 47 is formed on a corresponding one of the cap insulating films 46. However, the gate electrodes 44 can be connected to the outside at positions that are not shown in the drawing. Hereinafter, the gate insulating films 42 and the gate electrodes 44 that are formed in the trenches 40 respectively will be referred to comprehensively as trench gate electrodes 48 in some cases. As shown in FIG. 2, the respective trench gate electrodes 48 extend parallel to one another.

Emitter regions 20, top body regions 22, floating regions 24, bottom body regions 26, a drift region 28, a buffer region 30, and a collector region 32 are formed inside the semiconductor substrate 12.

The emitter regions 20 are n-type regions, and are selectively formed in such a range as to be exposed to an upper face of the semiconductor substrate 12. The emitter regions 20 are in contact with the gate insulating films 42 respectively. As shown in FIG. 2, the emitter regions 20 extend parallel to one another along the trench gate electrodes 48 respectively.

The top body regions 22 are p-type regions, and are formed below the emitter regions 20 and beside the emitter regions 20 respectively. As shown in FIGS. 1 and 2, each of the top body regions 22 is exposed to the upper face of the semiconductor substrate 12, between two corresponding ones of the two emitter regions 20. Besides, the top body regions 22 are in contact with the gate insulating films 42 below the emitter regions 20 respectively.

The floating regions 24 are n-type regions, and are formed below the top body regions 22 respectively. The floating regions 24 are separated from the emitter regions 20 by the top body regions 22 respectively. The floating regions 24 are in contact with the gate insulating films 42 respectively. Upper borders of the floating regions 24 are displaced upward as the distances to the gate insulating films 42 decrease respectively. Lower borders of the floating regions 24 are displaced downward as the distances to the gate insulating films 42 decrease respectively. Accordingly, the widths of the floating regions 24 along the thickness direction of the semiconductor substrate 12 change depending on their positions. That is, a width W1 of the floating regions 24 at positions in contact with the gate insulating films 42 is larger than a width W2 of the floating regions 24 at positions away from the gate insulating films 42. Those sections of the floating regions 24 which have the width W1 will be referred to hereinafter as wide portions 24a.

The bottom body regions 26 are p-type regions, and are formed below the floating regions 24 respectively. The bottom body regions 26 are separated from the top body regions 22 by the floating regions 24 respectively. The bottom body regions 26 are in contact with the gate insulating films 42 respectively. Lower borders of the bottom body regions 26 are located lower at positions in contact with the gate insulating films 42 than at positions away from the gate insulating films 42, respectively. That is, displacement portions 26a that are displaced downward along the gate insulating films 42 respectively are formed in those sections of the bottom body regions 26 which are in contact with the gate insulating films 42 respectively.

The drift region 28 is an n-type region that contains a low concentration of n-type impurities. The drift region 28 is formed below the bottom body regions 26. The drift region 28 is separated from the floating regions 24 by the bottom body regions 26 respectively. The drift region 28 is in contact with the gate insulating films 42 that are located at lower ends of the trenches 40 respectively.

The buffer region 30 is an n-type region that contains a higher concentration of n-type impurities than the drift region 28. The buffer region 30 is formed below the drift region 28.

The collector region 32 is a p-type region that contains a high concentration of p-type impurities. The collector region 32 is formed in such a range as to be exposed to a lower face of the semiconductor substrate 12. The collector region 32 is separated from the bottom body regions 26 by the drift region 28 and the buffer region 30.

The respective regions are formed inside the semiconductor substrate 12 as described above. Therefore, each of the trenches 40 is arranged in such a manner as to penetrate a corresponding one of the emitter regions 20, a corresponding one of the top body regions 22, a corresponding one of the floating regions 24, and a corresponding one of the bottom body regions 26, and to reach the drift region 28.

Besides, each of the gate electrodes 44 is opposed to a corresponding one of the emitter regions 20, a corresponding one of the top body regions 22, a corresponding one of the floating regions 24, and a corresponding one of the bottom body regions 26, via a corresponding one of the gate insulating films 42 on a lateral face of a corresponding one of the trenches 40.

An emitter electrode 60 is formed on the upper face of the semiconductor substrate 12. The emitter electrode 60 is ohmically connected to the emitter regions 20 and the top body regions 22. The emitter electrode 60 is insulated from the gate electrodes 44 by the cap insulating films 46 and the interlayer insulating films 47 respectively. A collector electrode 62 is formed on a lower face of the semiconductor substrate 12. The collector electrode 62 is ohmically connected to the collector region 32.

Figure 3:
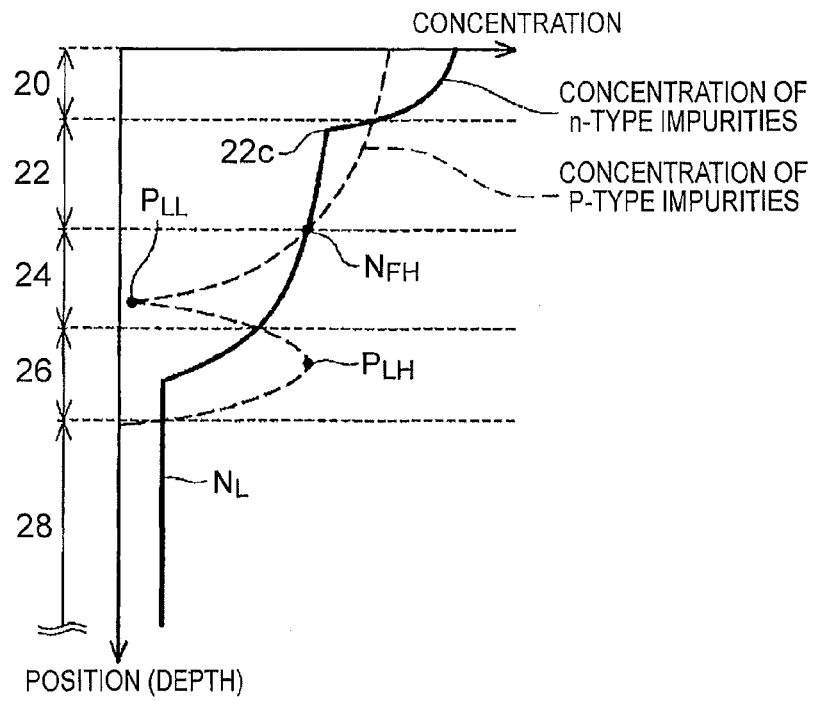
FIG. 3 is a graph showing the distribution of concentrations of impurities in a semiconductor substrate on a line A-A of FIG. 1.
Figure 4:
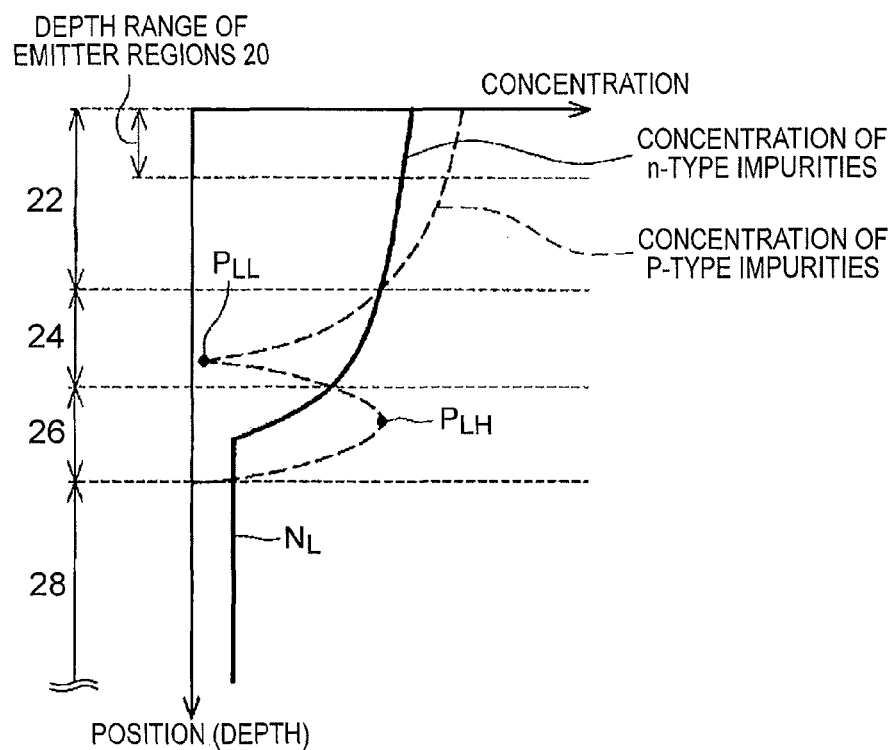
FIG. 4 is a graph showing the distribution of concentrations of impurities in the semiconductor substrate on a line B-B of FIG. 1.

FIG. 3 shows the distribution of concentrations of n-type impurities and p-type impurities in the semiconductor substrate 12 when viewed along a line A-A of FIG. 1. FIG. 4 shows the distribution of concentrations of n-type impurities and p-type impurities in the semiconductor substrate 12 when viewed along a line B-B of FIG. 1. Incidentally, in each of FIGS. 3 and 4 and the other drawings showing the distribution of concentrations of impurities (except FIG. 41), a graph that is rid of noise waveforms on a minor measurement error level is shown. Besides, each of these drawings employs a logarithmic axis as an axis representing concentration.

As shown in FIG. 3, the concentration of p-type impurities assumes a maximum value at upper ends of the emitter regions 20. The concentration of p-type impurities decreases as the downward distance increases from the upper ends of the emitter regions 20, and assumes a local minimum value $P_{LL}$ in the floating regions 24. The concentration of p-type impurities increases as the downward distance increases from positions of the local minimum value $P_{LL}$, and assumes a local maximum value $P_{LH}$ in the bottom body regions 26. The concentration of p-type impurities decreases as the downward distance increases from positions of the local maximum value $P_{LH}$, and becomes approximately equal to zero on borders between the bottom body regions 26 and the drift region 28.

The concentration of n-type impurities assumes a maximum value at the upper ends of the emitter regions 20. The concentration of n-type impurities decreases as the downward distance increases from the upper ends of the emitter regions 20. The rate of decrease in the concentration of n-type impurities becomes gentle at positions 22c in the top body regions 22. However, in regions below the positions 22c as well, the concentration of n-type impurities decreases as the downward distance increases. The concentration of n-type impurities decreases to a value $N_L$ in the bottom body regions 26. In the drift region 28, the concentration of n-type impurities is substantially constant, namely, substantially assumes the value $N_L$.

Besides, as shown in FIG. 4, on a line B-B as well, the concentration of p-type impurities is distributed substantially in the same manner as the concentration of p-type impurities on the line A-A. Besides, on the line B-B, the concentration of n-type impurities is lower than the concentration of p-type impurities in a depth range of the emitter regions 20. Even on the line B-B, below the depth range of the emitter regions 20, the concentration of n-type impurities is distributed substantially in the same manner as the concentration of n-type impurities on the line A-A.

Figure 5:
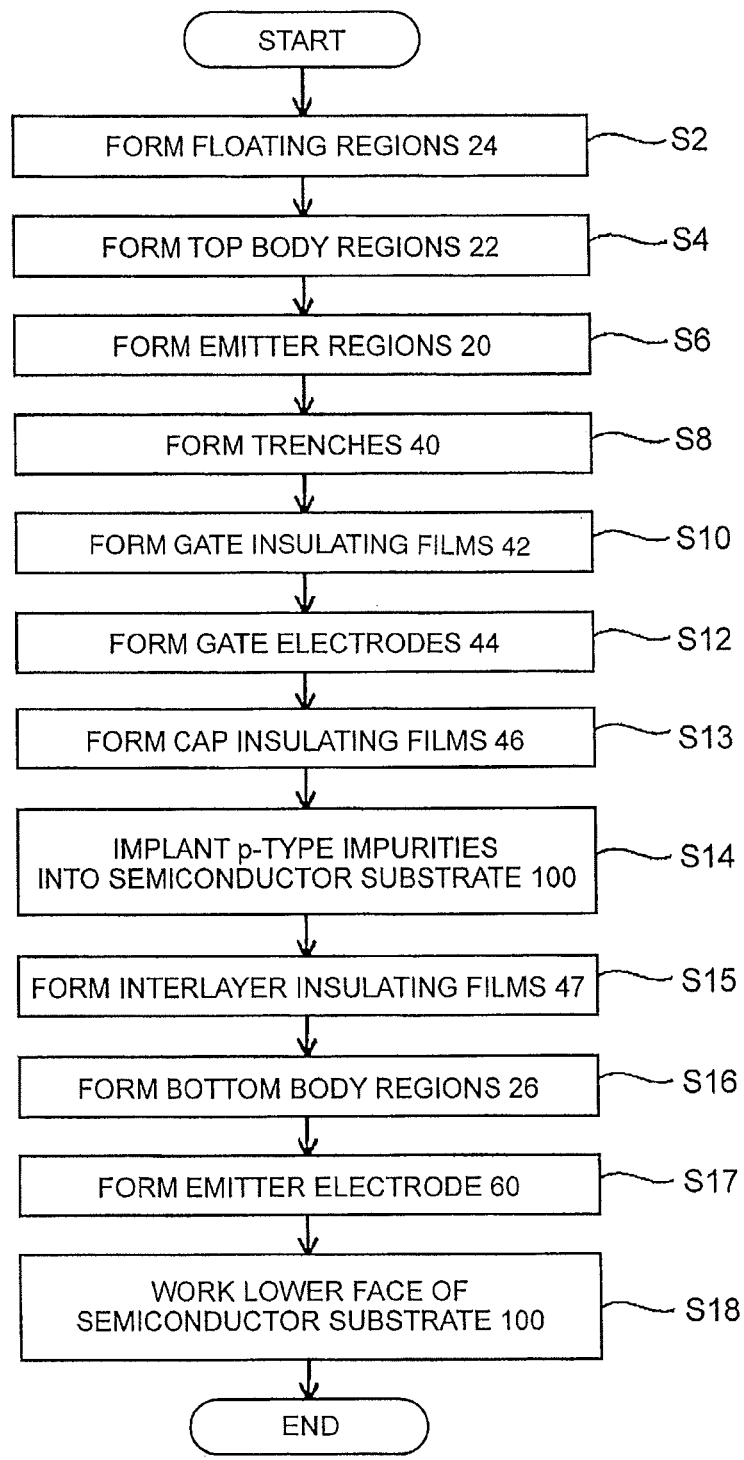
FIG. 5 is a flowchart showing a method of manufacturing the IGBT 10.
Figure 6:
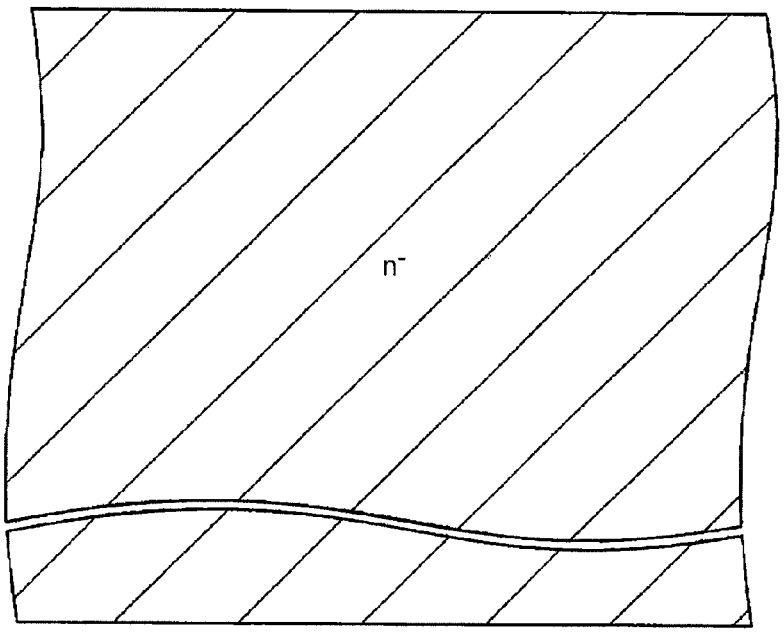
FIG. 6 is a longitudinal sectional view of a semiconductor substrate 100 before the start of the manufacturing method of FIG. 5.

Next, a method of manufacturing the IGBT 10 will be described. The IGBT 10 is manufactured according to a flowchart shown in FIG. 5. The IGBT 10 is manufactured from a semiconductor substrate 100 shown in FIG. 6. The semiconductor substrate 100 is an n-type silicon substrate having a concentration $N_L$ of n-type impurities that is approximately equal to that of the drift region 28 (about $1 \times 10^{14}$ cm$^3$ in this embodiment of the invention). The thickness of the semiconductor substrate 100 is about 700 μm.

Figure 7:
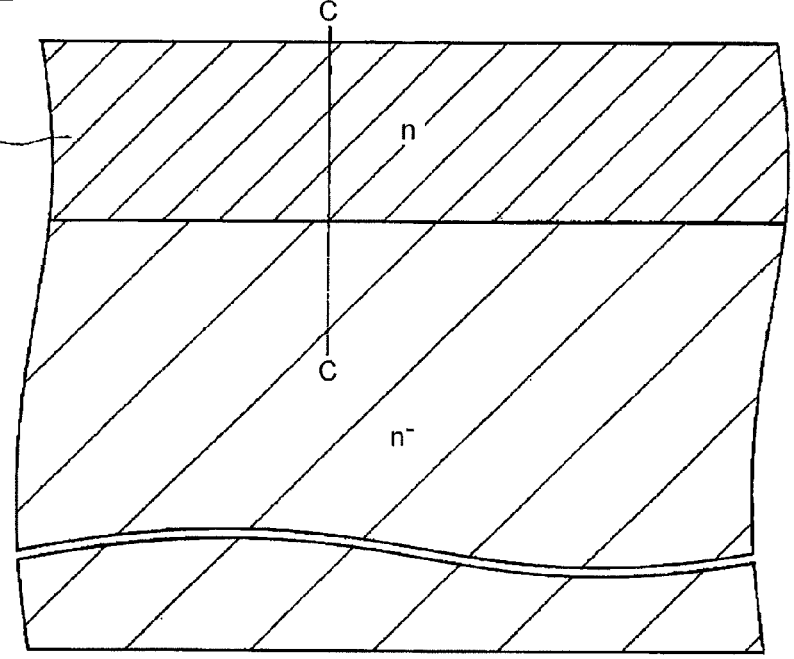
FIG. 7 is a longitudinal sectional view of the semiconductor substrate 100 after the execution of step S2.
Figure 8:
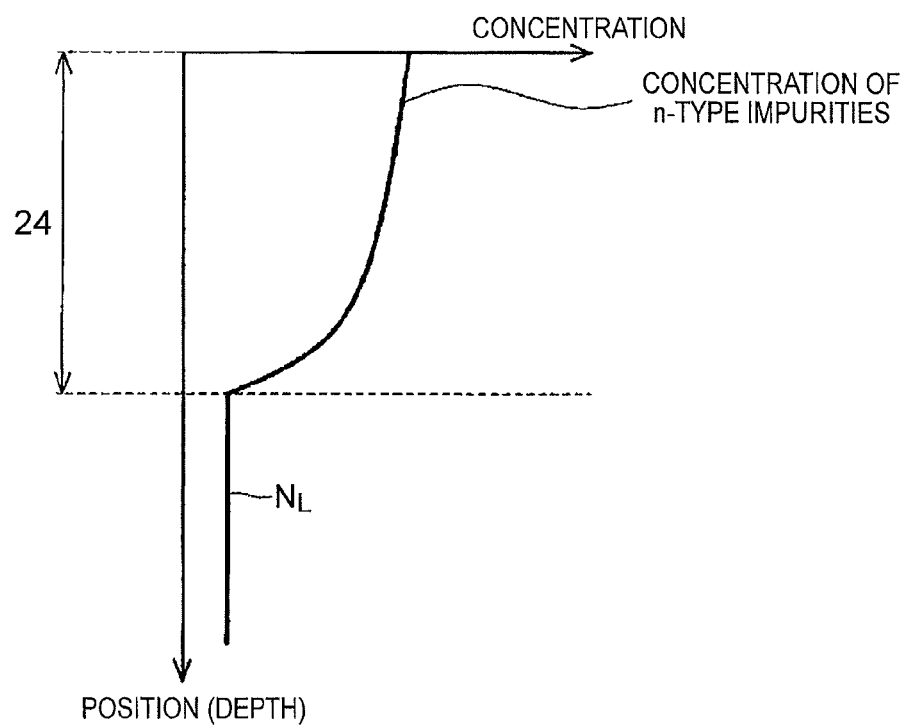
FIG. 8 is a graph showing the distribution of a concentration of impurities in the semiconductor substrate 100 on a line C-C of FIG. 7.

In step S2, as shown in FIG. 7, the floating regions 24 are formed in the semiconductor substrate 100. Specifically, first of all, n-type impurities (phosphorus in this embodiment of the invention) are ion-implanted into an upper face of the semiconductor substrate 100. In this case, the acceleration energy of ions is set to 30 keV to 300 keV, and the dose amount is set to $1 \times 10^{11}$ to $1 \times 10^{14}$ /cm$^2$. The implantation of n-type impurities is carried out such that the implanted n-type impurities stop in a region in the vicinity of the upper face of the semiconductor substrate 100 (in a depth range in which the emitter regions 20 are to be formed later). More specifically, the implantation of n-type impurities is carried out such that the average stop position of the implanted n-type impurities is located in the region in the vicinity of the upper face of the semiconductor substrate 100 (in the depth range in which the emitter regions 20 are to be formed later). Subsequently, the semiconductor substrate 100 is subjected to a heat treatment. In this case, the semiconductor substrate 100 is held under the atmosphere of nitrogen (N$_2$) or oxygen (O$_2$) at a temperature of 900 to 1250° C., for 30 to 120 minutes. Incidentally, the atmosphere for the heat treatment may be a mixed atmosphere of nitrogen and oxygen, or an atmosphere that is obtained by adding hydrogen (H$_2$) to oxygen, nitrogen or a mixture of these. By performing the heat treatment, the n-type impurities implanted into the semiconductor substrate 100 are diffused and activated. Thus, as shown in FIG. 7, the floating regions 24 are formed in the semiconductor substrate 100. As shown in FIG. 8, in the floating regions 24, the concentration of n-type impurities is highest at a position of the upper face of the semiconductor substrate 100, and the concentration of impurities decreases as the downward distance increases from the position. The concentration of n-type impurities is thus distributed because n-type impurities are implanted in such a manner as to stop in the vicinity of the upper face of the semiconductor substrate 100 and the n-type impurities are diffused.

Figure 9:
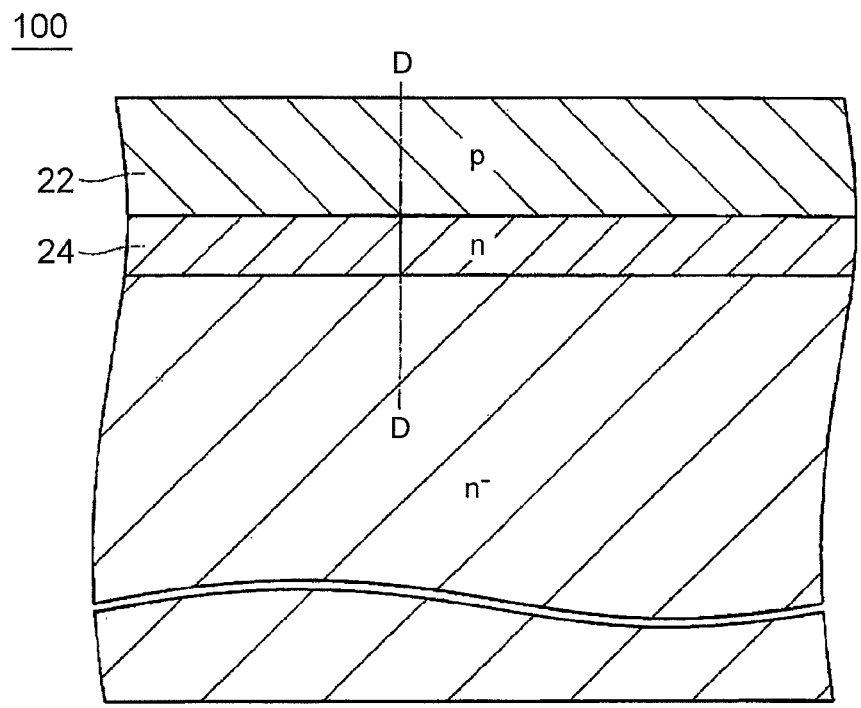
FIG. 9 is a longitudinal sectional view of the semiconductor substrate 100 after the execution of step S4.
Figure 10:
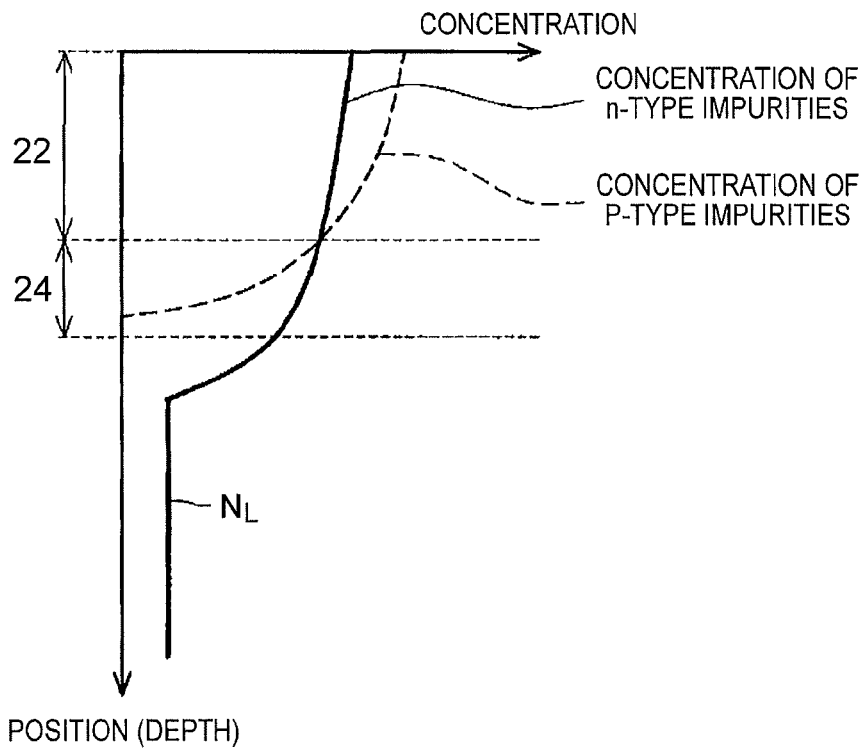
FIG. 10 is a graph showing the distribution of concentrations of impurities in the semiconductor substrate 100 on a line D-D of FIG. 9.

In step S4, as shown in FIG. 9, the top body regions 22 are formed in the semiconductor substrate 100. Specifically, first of all, p-type impurities (boron in this embodiment of the invention) are ion-implanted into the upper face of the semiconductor substrate 100. In this case, the acceleration energy of ions is set to 30 keV to 150 keV, and the dose amount is set to $1 \times 10^{11}$ to $5 \times 10^{14}$ /cm$^2$. The implantation of p-type impurities is carried out such that the implanted p-type impurities stop in the region in the vicinity of the upper face of the semiconductor substrate 100 (in the depth range in which the emitter regions 20 are to be formed later). More specifically, the implantation of p-type impurities is carried out such that the average stop position of the implanted p-type impurities is located in the region in the vicinity of the upper face of the semiconductor substrate 100 (in the depth range in which the emitter regions 20 are to be formed later). Subsequently, the semiconductor substrate 100 is subjected to a heat treatment. In this case, the semiconductor substrate 100 is held under the atmosphere of nitrogen, oxygen, the mixture of nitrogen and oxygen, or a gas that is obtained by adding hydrogen thereto at a temperature of 900 to 1250° C., for 30 to 120 minutes. By performing the heat treatment, the p-type impurities implanted into the semiconductor substrate 100 are diffused and activated. Thus, as shown in FIG. 9, the top body regions 22 are formed inside the semiconductor substrate 100. As shown in FIG. 10, the concentration of p-type impurities in the semiconductor substrate 100 is highest at a position of the upper face of the semiconductor substrate 100, and decreases as the downward distance increases from the position. The concentration of p-type impurities is thus distributed because p-type impurities are implanted in such a manner as to stop in the vicinity of the upper face of the semiconductor substrate 100 and the p-type impurities are diffused.

Figure 11:
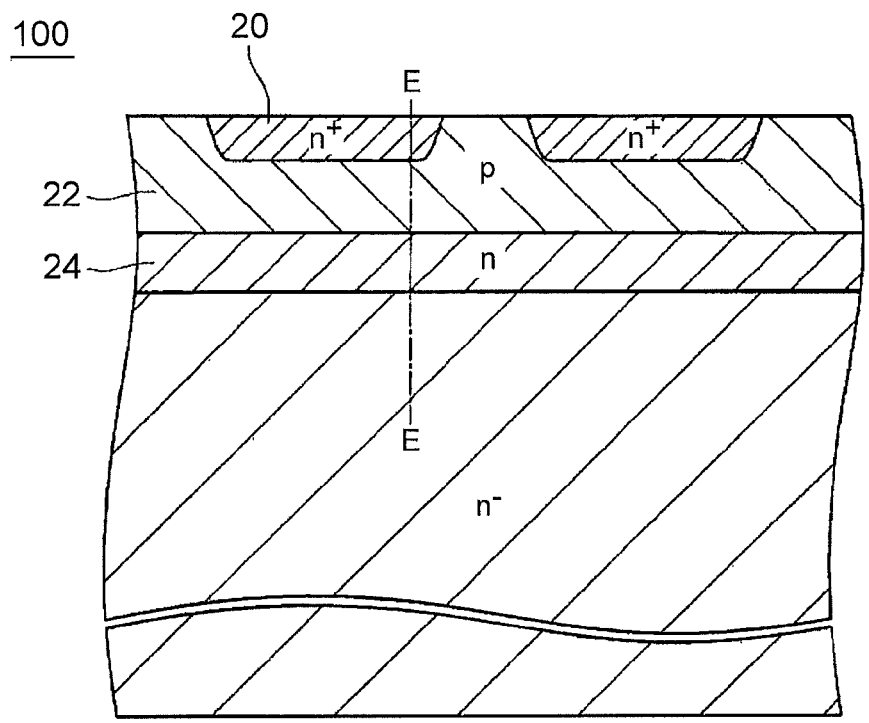
FIG. 11 is a longitudinal sectional view of the semiconductor substrate 100 after the execution of step S6.
Figure 12:
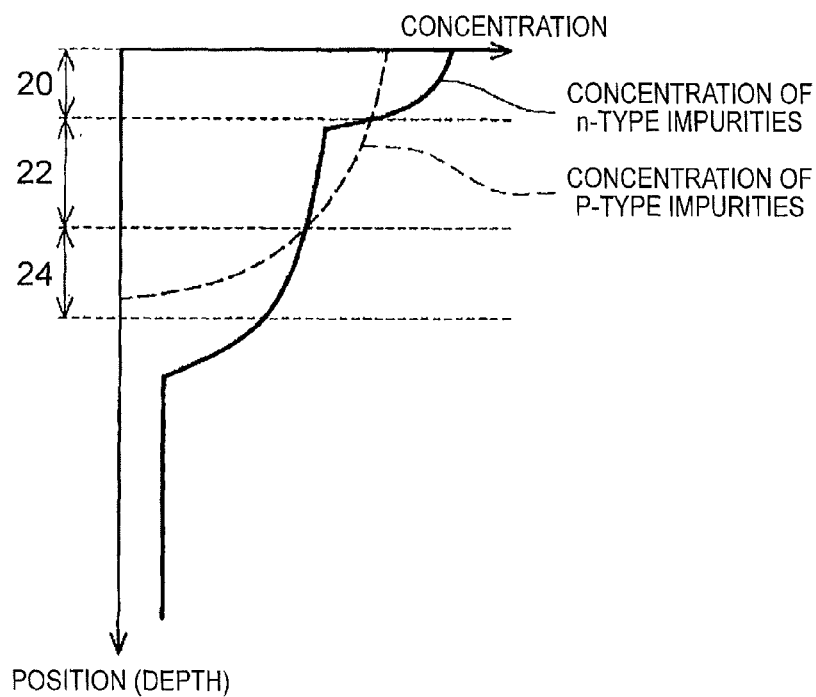
FIG. 12 is a graph showing the distribution of concentrations of impurities in the semiconductor substrate 100 on a line E-E of FIG. 11.

In step S6, as shown in FIG. 11, the emitter regions 20 are formed in the semiconductor substrate 100. Specifically, first of all, a resist is formed on the upper face of the semiconductor substrate 100. The resist is formed in such a manner as to cover a range where the emitter regions 20 are not formed (a range where the top body regions 22 are exposed to the upper face of the semiconductor substrate 100 in FIG. 11). Subsequently, n-type impurities (arsenic in this embodiment of the invention) are ion-implanted into the upper face of the semiconductor substrate 100. In this case, the acceleration energy of ions is set to 30 keV to 150 keV, and the dose amount is set to $1 \times 10^{13}$ to $1 \times 10^{16}$/cm$^2$. Thus, n-type impurities are implanted into the upper face of the semiconductor substrate 100 in a range that is not covered with the resist. Besides, the implantation of n-type impurities is carried out such that the implanted n-type impurities stop in the region in the vicinity of the upper face of the semiconductor substrate 100. Subsequently, the semiconductor substrate 100 is subjected to a heat treatment. In this case, the semiconductor substrate 100 is held under the atmosphere of nitrogen, oxygen, the mixture of nitrogen and oxygen, or a gas that is obtained by adding hydrogen thereto at a temperature of 900 to 1250° C., for 20 to 120 minutes. By performing the heat treatment, the n-type impurities implanted into the semiconductor substrate 100 are diffused and activated. Thus, as shown in FIG. 11, the emitter regions 20 are formed. As shown in FIG. 12, the concentration of n-type impurities in the emitter regions 20 is highest at the position of the upper face of the semiconductor substrate 100, and decreases as the downward distance increases from the position. The concentration of n-type impurities is thus distributed because n-type impurities are implanted in such a manner as to stop in the vicinity of the upper face of the semiconductor substrate 100 and the n-type impurities are diffused.

Figure 13:
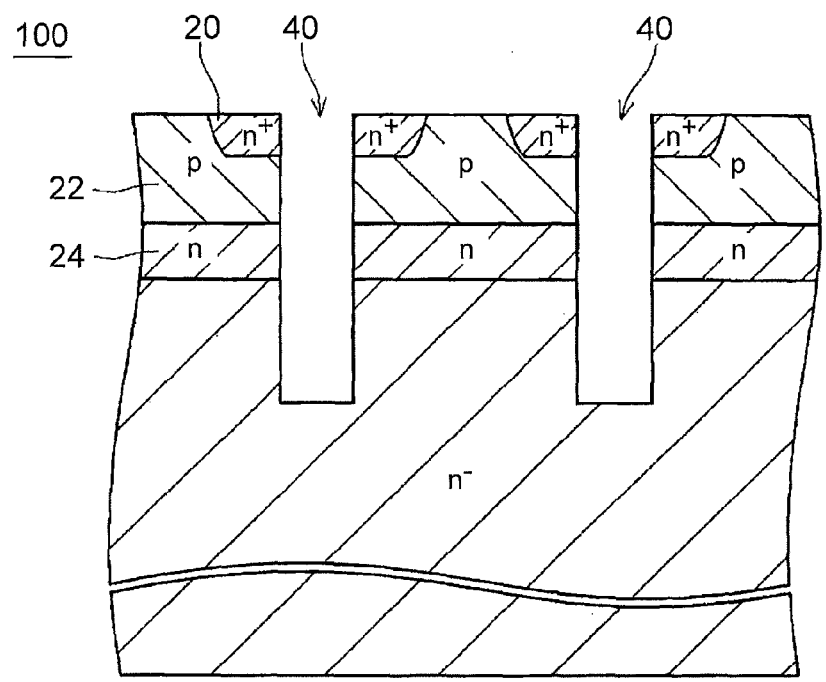
FIG. 13 is a longitudinal sectional view of the semiconductor substrate 100 after the execution of step S8.

In step S8, as shown in FIG. 13, the trenches 40 are formed in the upper face of the semiconductor substrate 100. Specifically, first of all, an etching mask is formed on the upper face of the semiconductor substrate 100. Opening portions are formed in the etching mask in regions where the trenches 40 should be formed, respectively. Subsequently, the upper face of the semiconductor substrate 100 in the opening portions is etched through anisotropic etching such as RIE or the like. Thus, the trenches 40 are formed in the upper face of the semiconductor substrate 100. The trenches 40 are formed in such a manner as to reach a depth equivalent to the drift region 28 of FIG. 1. The etching mask is removed after etching.

Figure 14:
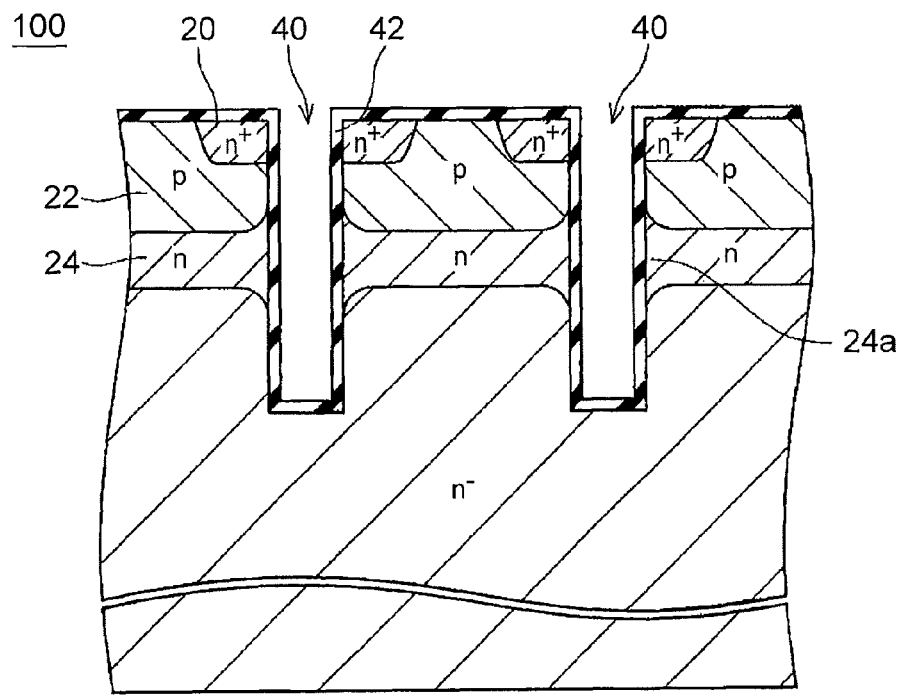
FIG. 14 is a longitudinal sectional view of the semiconductor substrate 100 after the execution of step S10.

In step S10, the semiconductor substrate 100 is subjected to a heat treatment at 800 to 1150° C. in an oxidation atmosphere. Thus, as shown in FIG. 14, an oxidation film is formed on the surface of the semiconductor substrate 100. At this time, oxidation films are formed on inner faces of the trenches 40 as well, respectively. The oxidation films that are formed on the inner faces of the trenches 40 respectively are the gate insulating films 42. During the growth of the oxidation films (the gate insulating films 42) on the inner faces of the trenches 40, the growing oxidation films absorb p-type impurities from ambient regions, and discharge n-type impurities to the ambient regions from within themselves. This phenomenon is generally referred to as segregation. Due to this segregation, if the gate insulating films 42 are formed, the width of the floating regions 24 in the vicinity of the gate insulating films 42 (the width along the thickness direction of the semiconductor substrate 100) is enlarged as shown in FIG. 14. As a result, the wide portions 24a of the floating regions 24 are formed in such ranges as to be in contact with the gate insulating films 42, respectively.

Figure 15:
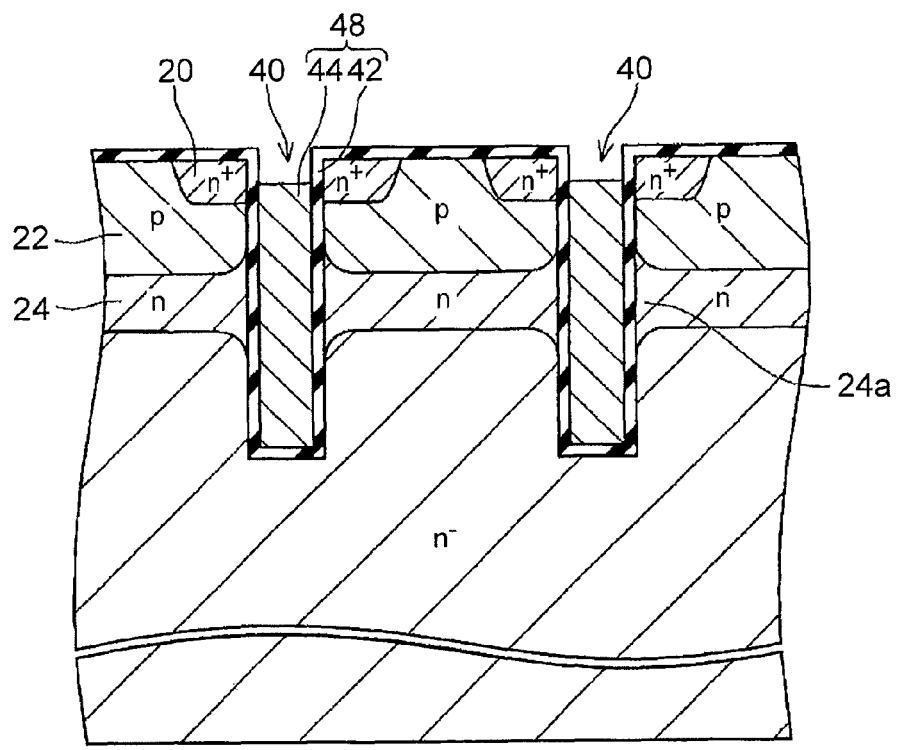
FIG. 15 is a longitudinal sectional view of the semiconductor substrate 100 after the execution of step S12.
Figure 16:
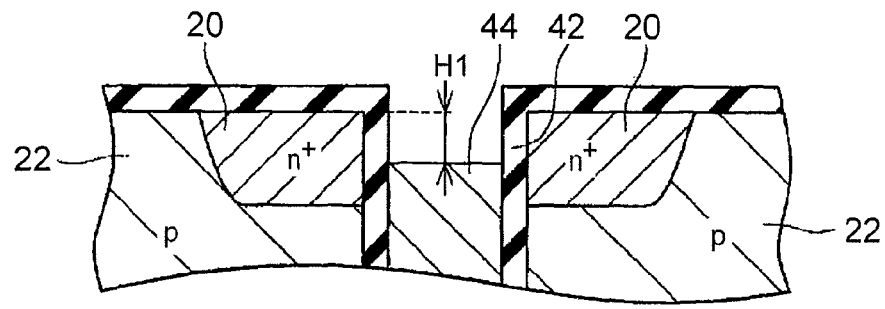
FIG. 16 is an enlarged view of an upper face of a gate electrode 44 of FIG. 15.

In step S12, polysilicon is caused to grow on the surface of the semiconductor substrate 100. Thus, the interiors of the trenches 40 are charged with polysilicon. Subsequently, the polysilicon formed on the upper face of the semiconductor substrate 100 is removed through etching. As a result, the semiconductor substrate 100 assumes a state shown in FIG. 15. As shown in FIG. 15, the gate electrodes 44 are formed by the polysilicon remaining inside the trenches 40. Incidentally, as shown in FIG. 16, step S12 is carried out such that the upper faces of the gate electrodes 44 are located below the upper face of the semiconductor substrate 100. That is, after the execution of step S12, bumps H1 are formed between the gate electrodes 44 and the upper face of the semiconductor substrate 100 respectively.

In step S13, the semiconductor substrate 100 is subjected to a heat treatment in an oxidation atmosphere. Thus, the upper faces of the gate electrodes 44 are oxidized to form the cap insulating films 46 respectively. In this case, the cap insulating films 46 with a thickness of about 30 nm are formed.

In step S14, with a view to forming the bottom body regions 26, p-type impurities are implanted into the semiconductor substrate 100. Specifically, first of all, p-type impurities (boron in this embodiment of the invention) are ion-implanted into the upper face of the semiconductor substrate 100. In this case, the acceleration energy of ions is set to 300 keV to 3 MeV, and the dose amount is set to $1 \times 10^{11}$ to $1 \times 10^{14}$ cm$^2$. This implantation of p-type impurities is carried out such that the implanted p-type impurities stop in regions located below the floating regions 24 (in a depth range in which the bottom body regions 26 should be formed). More specifically, this implantation of p-type impurities is carried out such that the average stop position of the implanted p-type impurities is in the regions located below the floating regions 24 (in the depth range in which the bottom body regions 26 should be formed).

In step S15, the interlayer insulating films 47 are formed on the semiconductor substrate 100 through CVD. In this case, the interlayer insulating films 47 with a thickness of about 1000 nm are formed.

Figure 17:
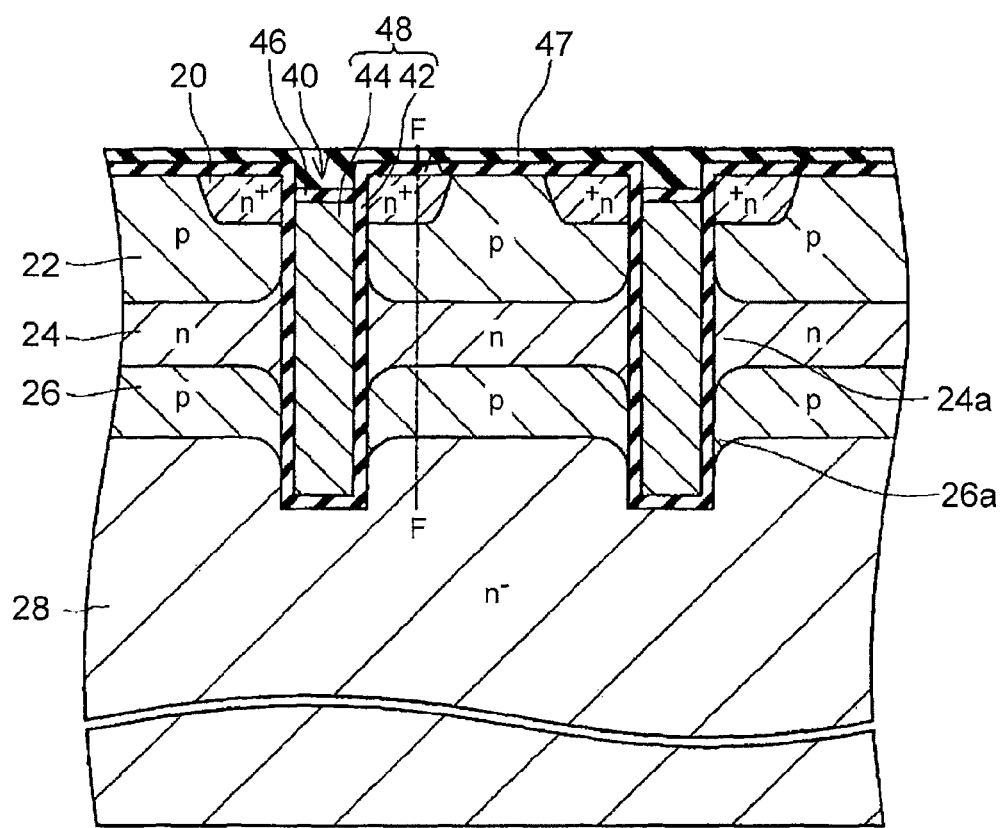
FIG. 17 is a longitudinal sectional view of the semiconductor substrate 100 after the execution of step S14.

In step S16, the bottom body regions 26 are formed. Specifically, the semiconductor substrate 100 is subjected to a heat treatment through reflow. In this heat treatment, the semiconductor substrate 100 is held in the atmosphere of nitrogen (i.e., in a non-oxidative atmosphere) at a temperature of 900 to 1000° C., for 15 to 60 minutes. By performing the heat treatment, the p-type impurities implanted into the semiconductor substrate 100 are diffused and activated. Thus, as shown in FIG. 17, the bottom body regions 26 are formed in the semiconductor substrate 100. Incidentally, since this heat treatment is performed in the non-oxidative atmosphere, an OSF is prevented from being produced in the semiconductor substrate 100. Besides, the n-type region below the bottom body regions 26 is the drift region 28. If step S14 is executed, the distribution of the concentrations of impurities in the semiconductor substrate 100 along a line F-F of FIG. 17 becomes the distribution shown in FIG. 3. The local maximum value $P_{LH}$ of the concentration of p-type impurities is formed in the bottom body regions 26 because the ion implantation of step S14 is carried out such that the p-type impurities stop in the ranges where the bottom body regions 26 should be formed. Besides, since the concentration of p-type impurities in the bottom body regions 26 thus becomes high, the local minimum value $P_{LL}$ of the concentration of p-type impurities is formed in the floating regions 24.

Incidentally, as described above, during implantation of p-type impurities in step S14, the bumps H1 are formed between the upper faces of the gate electrodes 44 and the upper face of the semiconductor substrate 100 respectively. Thus, due to the influence of the shape of the bumps H1, the average stop position of the p-type impurities is located lower in the regions in the vicinity of the trench gate electrodes 48 than in the regions away from the trench gate electrodes 48, respectively. Thus, the displacement portions 26a are formed in the bottom body regions 26 in such ranges as to be in contact with the gate insulating films 42, respectively.

Figure 18:
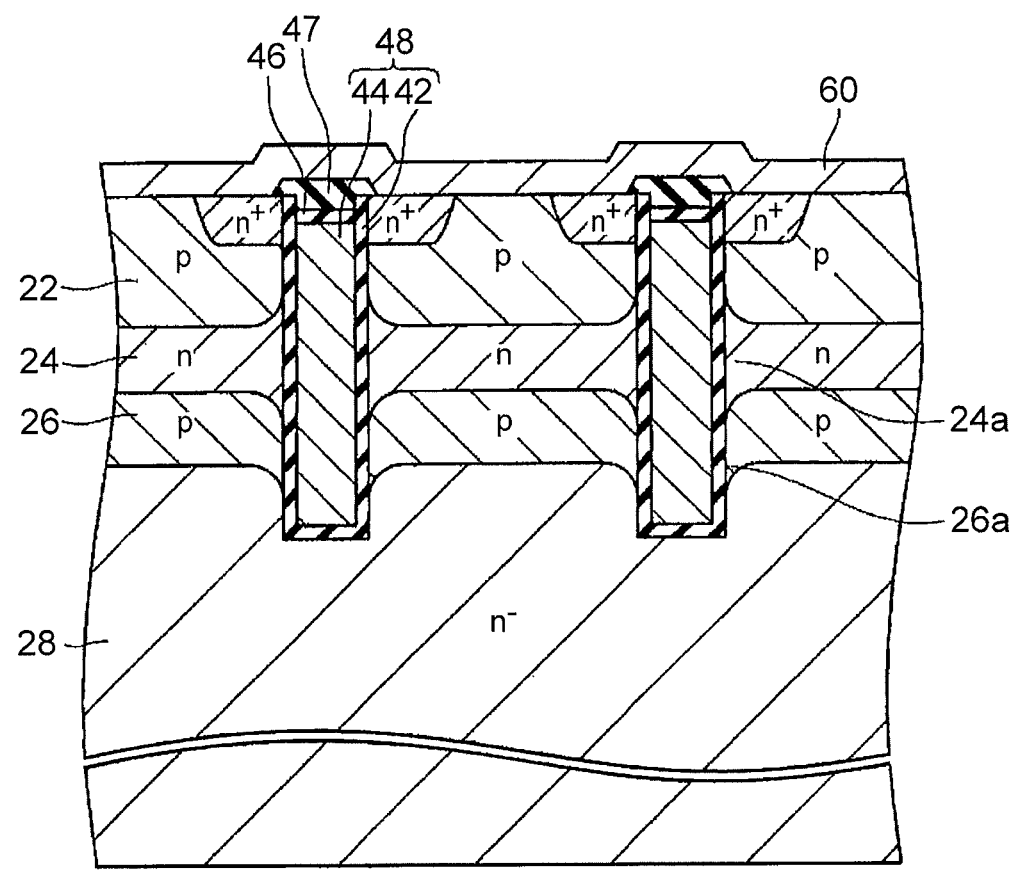
FIG. 18 is a longitudinal sectional view of the semiconductor substrate 100 after the execution of step S16.

In step S17, the insulating films that cover the emitter regions 20 and the top body regions 22 respectively are removed. Subsequently, as shown in FIG. 18, the emitter electrode 60 is formed on the upper face of the semiconductor substrate 100.

In step S18, the lower face of the semiconductor substrate 100 is worked. Specifically, first of all, the lower face of the semiconductor substrate 100 is polished to thin the semiconductor substrate 100. Subsequently, the buffer region 30 and the collector region 32 are formed inside the semiconductor substrate 100 by subjecting the lower face of the semiconductor substrate 100 to ion implantation and a heat treatment. After that, the collector electrode 62 is formed on the lower face of the semiconductor substrate 100. If step S18 is executed, the IGBT 10 shown in FIG. 1 is completed.

Next, the operation of the IGBT 10 will be described. If a voltage equal to or higher than a gate threshold voltage (a minimum required gate voltage for turning the IGBT 10 on) is applied to the gate electrodes 44 with a voltage applied between the emitter electrode 60 and the collector electrode 62 such that the voltage of the collector electrode 62 assumes a positive value, the IGBT 10 is turned on. That is, channels are formed through the top body regions 22 and the bottom body regions 26 in such ranges as to be in contact with the gate insulating films 42 respectively, and electrons flow from the emitter regions 20 to the collector region 32 through the channels respectively. At the same time, holes flow from the collector region 32 into the drift region 28. Due to the holes flowing into the drift region 28, a phenomenon of conductivity modulation occurs in the drift region 28, and the electric resistance of the drift region 28 falls. Accordingly, the electrons flow in the drift region 28 with low loss. Besides, the holes that have flowed into the drift region 28 flow from the drift region 28 toward the top body regions 22. However, the floating regions 24 exist between the drift region 28 and the top body regions 22 respectively, and these floating regions 24 serve as barriers, thus restraining the holes from moving toward the top body regions 22 respectively. Thus, the concentration of holes in the drift region 28 becomes high, and the electric resistance of the drift region 28 is further reduced. Thus, the ON-state voltage of the IGBT 10 is reduced.

Besides, in the aforementioned manufacturing method, the top body regions 22 are formed by diffusing the p-type impurities implanted into the vicinity of the upper face of the semiconductor substrate 100. As a result, in the top body regions 22, the concentration of p-type impurities decreases as the downward distance increases or as the upward distance decreases. According to this method, the top body regions 22 can be formed without forming a defect such as an OSF or the like in the semiconductor substrate 100 or without being influenced by the shape of the trench gate electrodes 48. That is, the positions of the top body regions 22 and the concentration of p-type impurities in the top body regions 22 can be accurately controlled. Thus, if the IGBT's 10 according to the first embodiment of the invention are mass-produced, the gate threshold voltage is unlikely to be dispersed among the mass-produced IGBT's 10.

Besides, in the aforementioned manufacturing method, the bottom body regions 26 are formed by directly implanting p-type impurities to the depth of the bottom body regions 26 after forming the trench gate electrodes 48. Thus, the bottom body regions 26 can be formed with the concentration of p-type impurities in the floating regions 24 hardly raised. As a result, the local minimum values $P_{LL}$ of the concentration of p-type impurities is formed in the floating regions 24. For this reason, the difference between the concentration of n-type impurities and the concentration of p-type impurities is relatively large in the floating regions 24. Thus, the floating regions 24 are likely to be stably formed. Thus, if the IGBT's 10 according to the first embodiment of the invention are mass-produced, the ON-state voltage is unlikely to be dispersed among the mass-produced IGBT's 10.

Besides, if p-type impurities are implanted to the depth of the bottom body regions 26 after thus forming the trench gate electrodes 48, the implantation depth of p-type impurities in the vicinity of the trench gate electrodes 48 changes in accordance with the shape of the bumps H1 in upper portions of the trench gate electrodes 48. Thus, the implantation depth of p-type impurities in the vicinity of the trench gate electrodes 48 cannot be controlled very accurately. However, the concentration of p-type impurities in the bottom body regions 26 in the vicinity of the trench gate electrodes 48 has a small influence on the ON-state voltage and gate threshold voltage of the IGBT 10. Accordingly, the ON-state voltage and the gate threshold voltage are hardly dispersed due to this influence.

Besides, if the bottom body regions 26 are thus formed, the displacement portions 26a can be formed in the bottom body regions 26 respectively. Thus, the following advantages are obtained. In the IGBT 10, a protrusion amount L1 of the trench gate electrodes 48 that protrude below the bottom body regions 26 respectively is relatively large. Thus, the holes that are present in the drift region 28 in the vicinity of the bottom body regions 26 are blocked by the protruding trench gate electrodes 48 respectively, and are restrained from moving laterally in the drift region 28. For this reason, a large number of holes are accumulated in the drift region 28 in the vicinity of the bottom body regions 26. Thus, the ON-state voltage of the IGBT 10 is reduced. On the other hand, in general, if the protrusion amount of the trench gate electrodes is increased, the areas of contact between the gate insulating films and the drift region increase respectively, and the feedback capacity of the IGBT increases. However, in the aforementioned IGBT 10, the areas of contact between the gate insulating films 42 and the drift region 28 are small respectively, due to the formation of the displacement portions 26a. Accordingly, this IGBT 10 has a small feedback capacity despite the large protrusion amount L1. Accordingly, the switching loss caused in the IGBT 10 according to the first embodiment of the invention is small.

Besides, many of the holes that move from the drift region 28 to the top body regions 22 move through the floating regions 24 in the vicinity of the gate insulating films 42 (i.e., in the vicinity of the channels) respectively. In the aforementioned IGBT 10, the wide portions 24a of the floating regions 24 are formed in the vicinity of the gate insulating films 42 respectively. The wide portions 24a restrain the holes from moving from the drift region 28 to the top body regions 22 respectively. Thus, the ON-state voltage of the IGBT 10 is further reduced.

Incidentally, in the aforementioned first embodiment of the invention, the floating regions 24, the top body regions 22, and the emitter regions 20 are formed in this sequence, but the sequence in which these regions are formed may be changed in any manner. Besides, in the case where there is no need to form the wide portions 24a in the floating regions 24 respectively, the floating regions 24, the top body regions 22, and the emitter regions 20 may be formed after forming the trench gate electrodes 48. Incidentally, in the case where the emitter regions 20 are formed before forming the trench gate electrodes 48, it is preferable that arsenic be used as n-type impurities for forming the emitter regions 20 as described above. This is because arsenic is unlikely to be thermally diffused, and hence can be retained in target regions even upon receiving heat when the trench gate electrodes 48 are formed. In order to form the emitter regions 20, phosphorus can also be used instead of arsenic. In this case, phosphorus is likely to be thermally diffused. It is therefore better to form the emitter regions 20 after forming the trench gate electrodes 48. Besides, although phosphorus is used as n-type impurities for forming the floating regions 24 in the aforementioned first embodiment of the invention, arsenic may be used instead of phosphorus.

Figure 19:
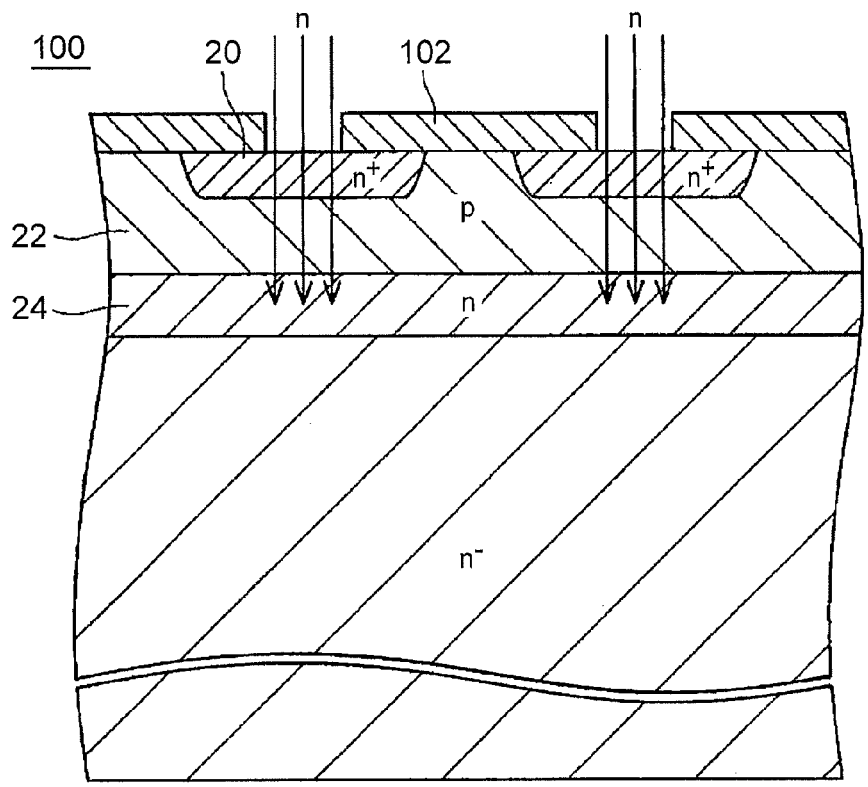
FIG. 19 is a longitudinal sectional view illustrating another method of forming a wide portion of a floating region 24.
Figure 20:
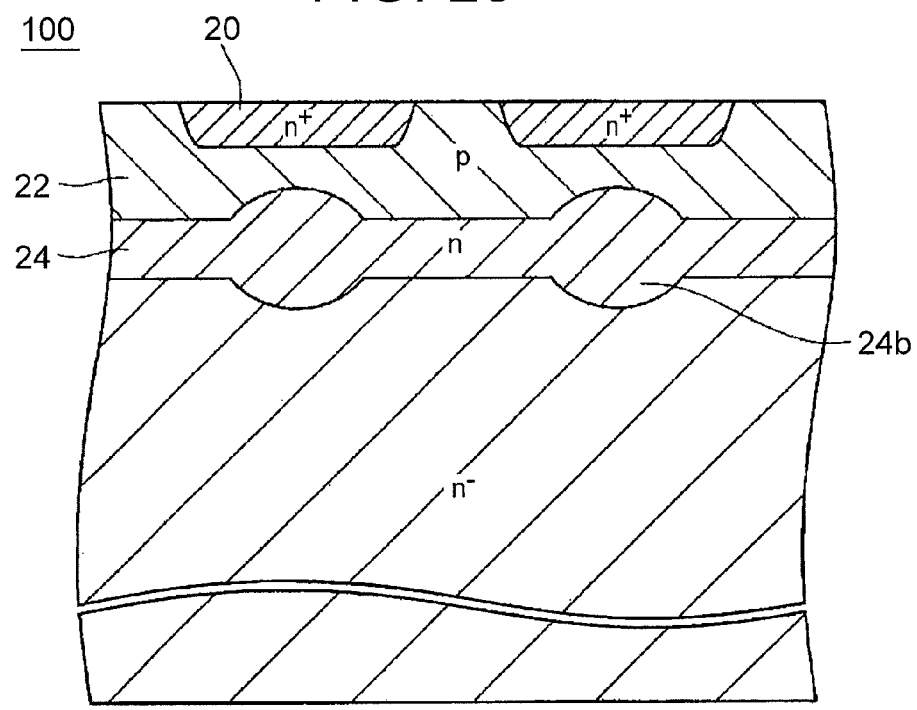
FIG. 20 is a longitudinal sectional view illustrating still another method of forming the wide portion of the floating region 24.
Figure 21:
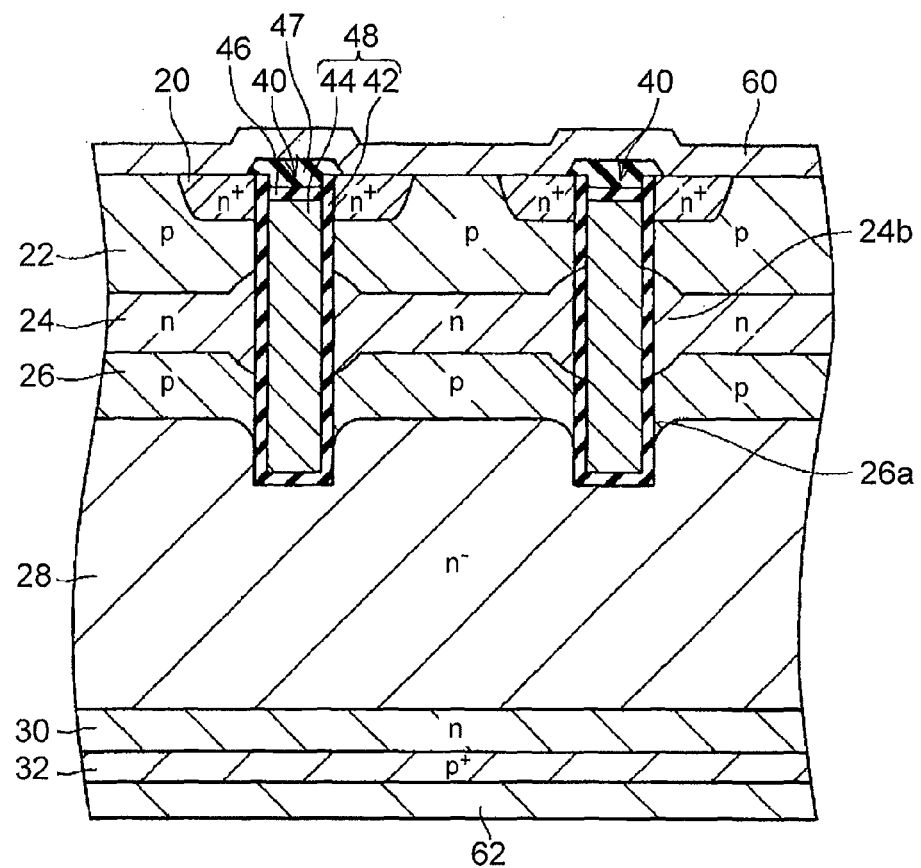
FIG. 21 is a longitudinal sectional view of an IGBT that has a wide portion 24b.

Besides, in the aforementioned first embodiment of the invention, the wide portions 24a are formed in the floating regions 24 respectively, by forming the gate insulating films 42 after forming the floating regions 24 and the top body regions 22. However, the wide portions may be formed in the floating regions 24 respectively according to the following method. In this method, first of all, the aforementioned steps S2 to 4 are carried out. Subsequently, as shown in FIG. 19, a mask 102 that is provided with opening portions in regions where the trenches 40 are formed respectively is formed on the upper face of the semiconductor substrate 100. Then, n-type impurities are implanted into the floating regions 24 across the mask 102, and the implanted n-type impurities are diffused and activated. Thus, as shown in FIG. 20, wide portions 24b are formed. After that, the trench gate electrodes 48 are formed in such a manner as to penetrate the wide portions 24b respectively, and other necessary processes are carried out to complete an IGBT shown in FIG. 21.

Figure 22:
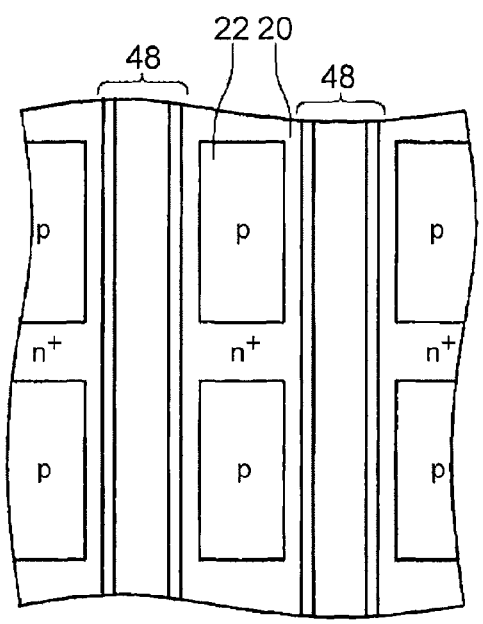
FIG. 22 is a top view of an IGBT according to a first modification example as a view corresponding to FIG. 2.
Figure 23:
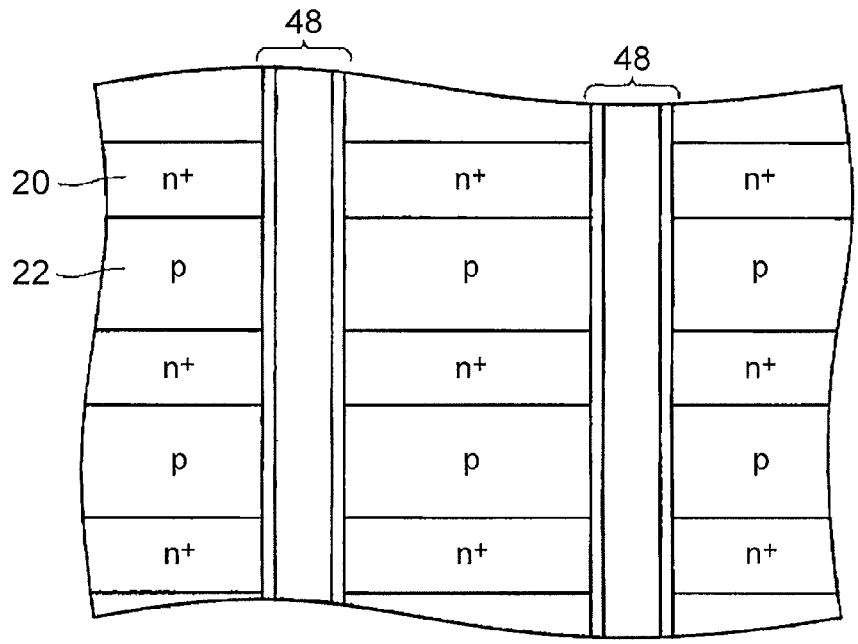
FIG. 23 is a top view of an IGBT according to a second modification example as a view corresponding to FIG. 2.

Besides, in the aforementioned first embodiment of the invention, the trench gate electrodes 48, the emitter regions 20, and the top body regions 22 are arranged as shown in FIG. 2 on the upper face of the semiconductor substrate. However, these regions may be arranged as shown in FIG. 22 or FIG. 23.

Figure 24:
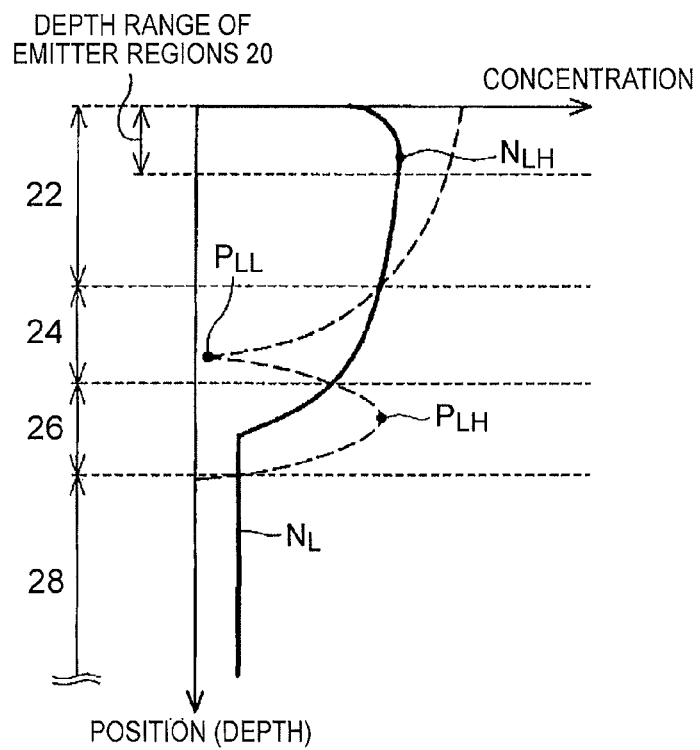
FIG. 24 is a graph of the distribution of concentrations of impurities in an IGBT according to a third modification example at a spot corresponding to FIG. 4.
Figure 25:
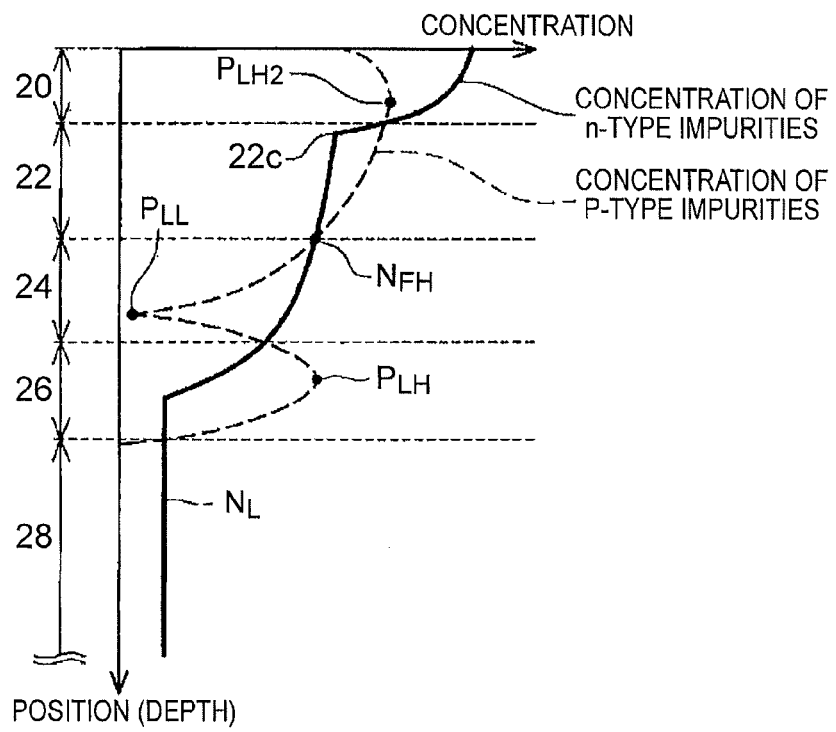
FIG. 25 is a graph of the distribution of concentrations of impurities in an IGBT according to a fourth modification example at a spot corresponding to FIG. 3.

Incidentally, in the first embodiment of the invention, the floating regions 24 are formed such that the concentration of n-type impurities is maximized at the upper end of the semiconductor substrate 100 as shown in FIG. 8. Therefore, in FIG. 4 (the distribution of concentrations of impurities on the line B-B of FIG. 1) as well, the concentration of n-type impurities is maximized at the upper end of the semiconductor substrate 100. However, if the aforementioned average stop position of n-type impurities becomes slightly deeper than in the first embodiment of the invention, the concentration of impurities on the line B-B becomes as shown in FIG. 24. That is, a local maximum value $N_{LH}$ of the concentration of n-type impurities is formed within the depth range of the emitter regions 20. In this manner, even if the local maximum value $N_{LH}$ of the concentration of n-type impurities is formed within the depth range of the emitter regions 20, no problem is caused in particular as long as there is no local maximum value of the concentration of n-type impurities in the top body regions 22 and the floating regions 24 that are located below the emitter regions 20 respectively. This is because the implantation depth of n-type impurities is shallow and hence no problem such as an OSF or the like is caused within the depth range of the emitter regions 20. By the same token, as shown in FIG. 25, a local maximum value $P_{LH2}$ of the concentration of p-type impurities may be within the depth range of the emitter regions 20.

Figure 26:
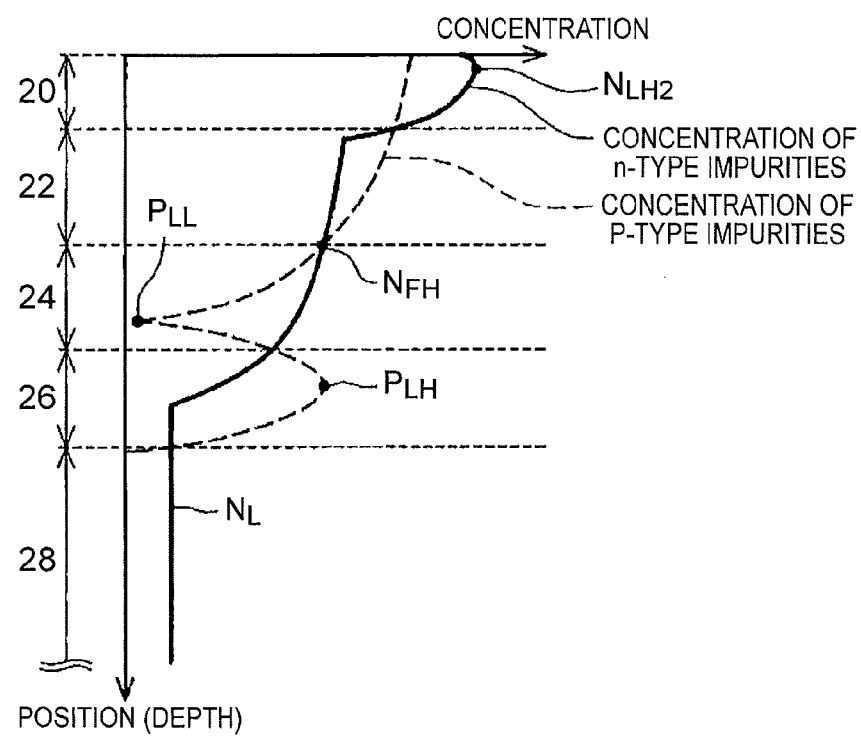
FIG. 26 is a graph of the distribution of concentrations of impurities in an IGBT according to a fifth modification example at the spot corresponding to FIG. 3.
Figure 27:
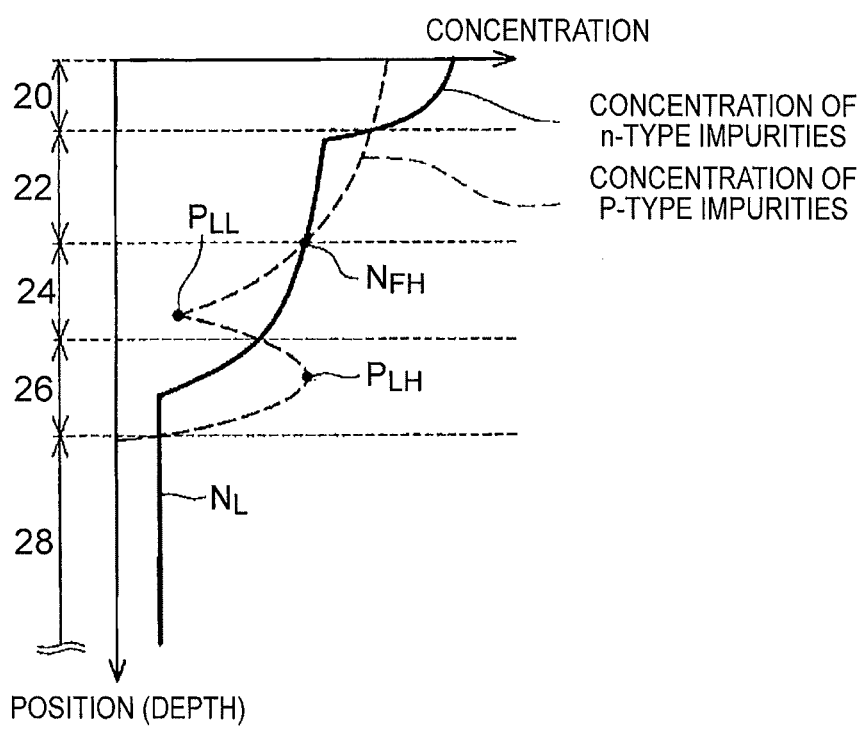
FIG. 27 is a graph of the distribution of concentrations of impurities in an IGBT according to a sixth modification example at the spot corresponding to FIG. 3.
Figure 28:
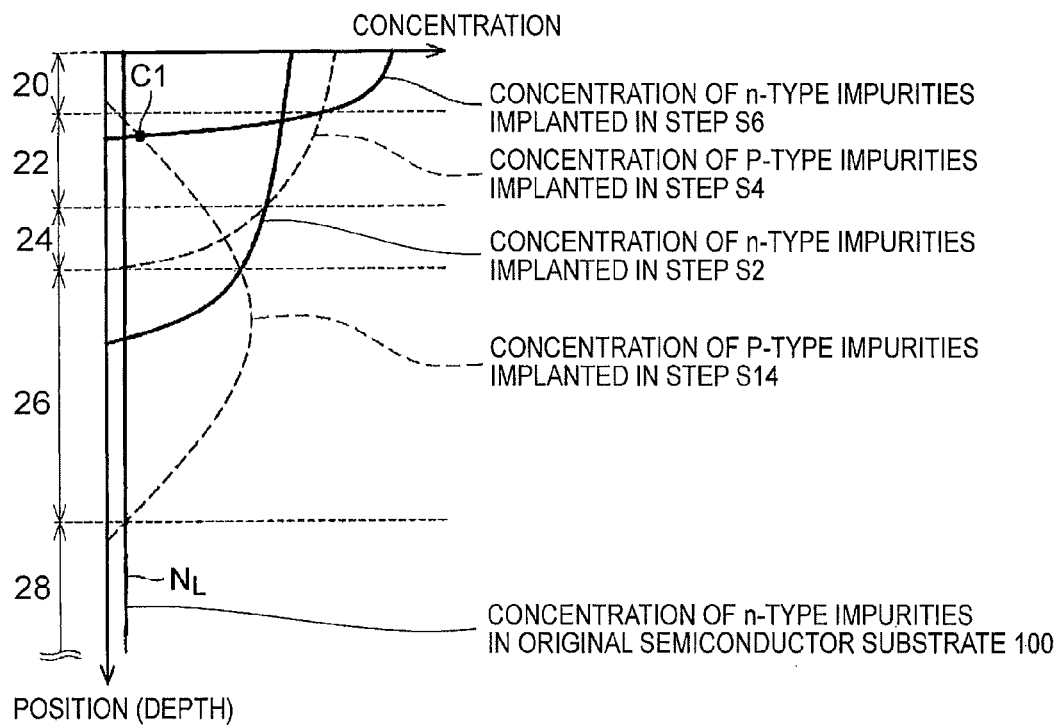
FIG. 28 is a graph of the distribution of concentrations of impurities in an IGBT according to a seventh modification example at the spot corresponding to FIG. 3.

Besides, as shown in FIG. 26, a local maximum value $N_{LH2}$ of the concentration of n-type impurities may be in the emitter regions 20. Besides, as shown in FIG. 27, the local minimum value $P_{LL}$ of the concentration of p-type impurities may be higher than the concentration $N_L$ of n-type impurities in the drift region 28. Besides, FIG. 28 depicts the distribution of concentrations of the impurities implanted in steps S2, S4, S6 and S14, separately for each of the steps. As shown in FIG. 28, some of the p-type impurities implanted in step S14 may be distributed in the emitter regions 20. For example, as shown in FIG. 28, the concentration of n-type impurities at an intersecting point C1 of a graph of the concentration of the p-type impurities implanted in step S14 and a graph of the concentration of the n-type impurities implanted in step S6 may be larger than the concentration $N_L$ of n-type impurities in the drift region 28 (the concentration of n-type impurities in the original semiconductor substrate 100).

Figure 29:
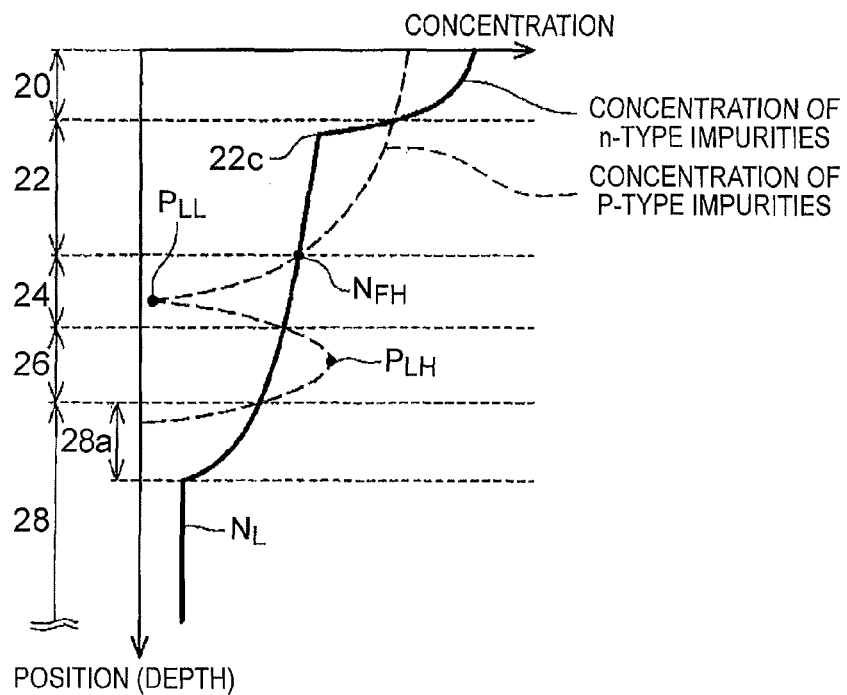
FIG. 29 is a graph of the distribution of concentrations of impurities in an IGBT according to an eighth modification example at the spot corresponding to FIG. 3.

Besides, as shown in FIG. 29, some of the n-type impurities implanted and diffused in step S2 may be distributed to a region below the bottom body regions 26. That is, a region 28a in which the concentration of n-type impurities is higher than the concentration $N_L$ may be formed below the bottom body regions 26. In this configuration, the drift region 28 is formed by an entire n-type region that includes the region 28a and is located below the bottom body regions. This structure can be formed by prolonging the diffusion distance of the n-type impurities implanted in step S2. By thus prolonging the diffusion distance of n-type impurities, the gradient of the distribution of the concentration of n-type impurities in the floating regions 24 becomes small, and the distribution of the concentration of n-type impurities becomes almost flat. For this reason, the floating regions 24 can be stably formed, and the dispersion of the ON-state voltage is further reduced. Besides, by thus prolonging the diffusion distance of n-type impurities, the concentration of n-type impurities in the top body regions 22 becomes low, and the dispersion of the gate threshold voltage is further reduced.

(Second Embodiment)

Figure 30:
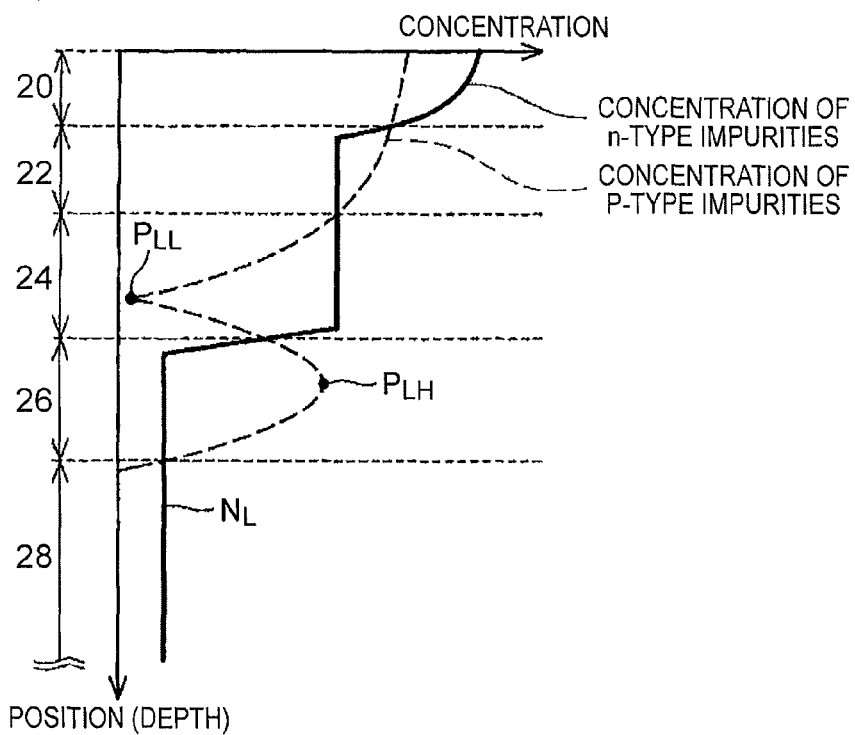
FIG. 30 is a graph of the distribution of concentrations of impurities in an IGBT according to a second embodiment of the invention at the spot corresponding to FIG. 3.

Next, an IGBT according to the second embodiment of the invention will be described. Respective portions are arranged in the IGBT according to the second embodiment of the invention substantially in the same manner as in the IGBT 10 according to the first embodiment of the invention shown in FIGS. 1 and 2. However, the IGBT according to the second embodiment of the invention is different in the distribution of the concentrations of impurities from the IGBT 10 according to the first embodiment of the invention. As shown in FIG. 30, in the IGBT according to the second embodiment of the invention, the concentration of n-type impurities is substantially constant in the top body regions 22 and the floating regions 24.

Figure 31:
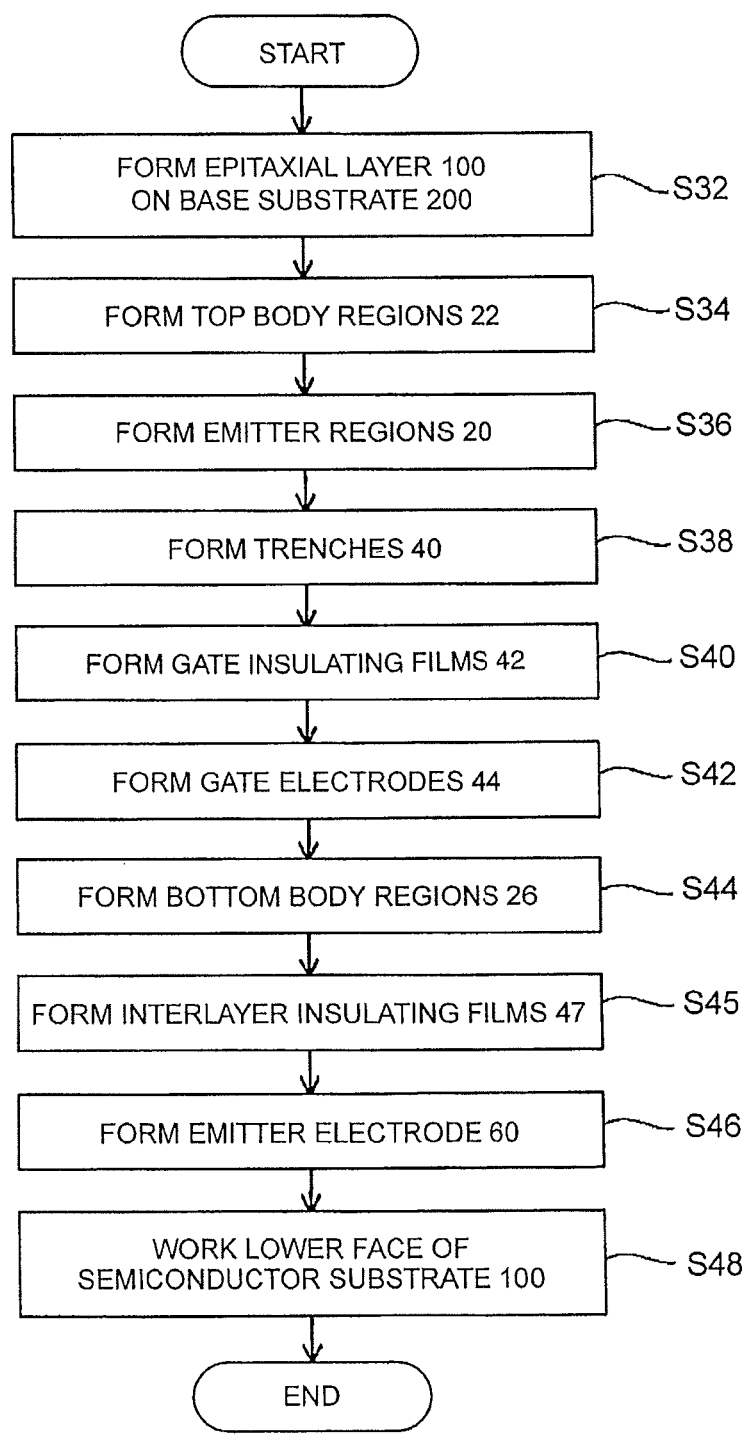
FIG. 31 is a flowchart showing a method of manufacturing the IGBT according to the second embodiment of the invention.

Next, a method of manufacturing the IGBT according to the second embodiment of the invention will be described. The IGBT according to the second embodiment of the invention is manufactured according to a flowchart of FIG. 31. The IGBT according to the second embodiment of the invention is manufactured from a silicon substrate (hereinafter referred to as a base substrate) that has substantially the same concentration $N_L$ of n-type impurities as in the drift region 28.

Figure 32:
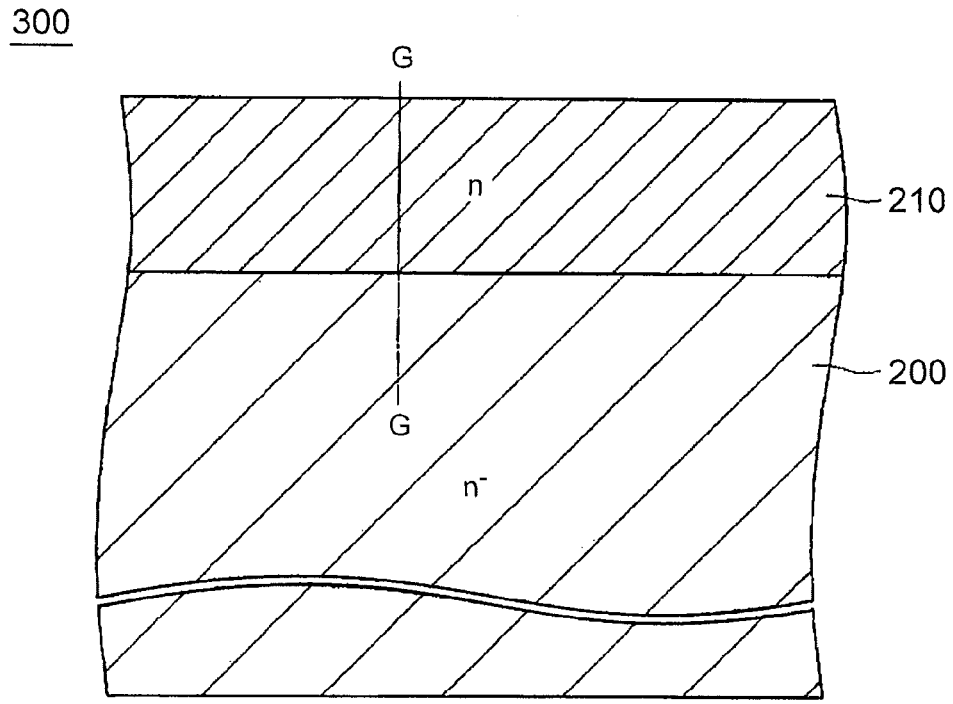
FIG. 32 is a longitudinal sectional view of a semiconductor substrate 300 after the execution of step S32.
Figure 33:
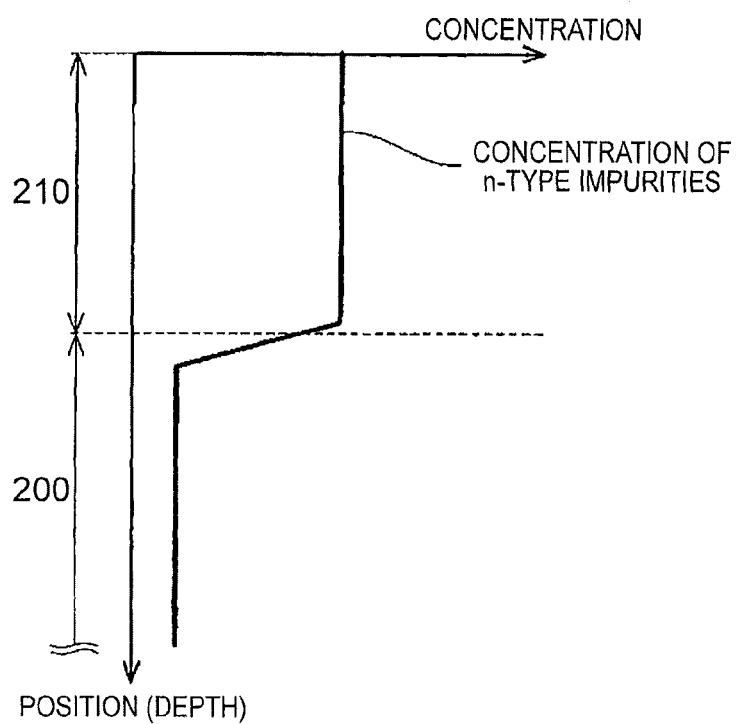
FIG. 33 is a graph showing the distribution of a concentration of impurities in the semiconductor substrate 300 on a line G-G of FIG. 32.

In step S32, as shown in FIG. 32, an n-type semiconductor layer 210 in which the concentration of n-type impurities is higher than in a base substrate 200 is caused to epitaxially grow on the base substrate 200. The n-type semiconductor layers 210 will be referred to hereinafter as an epitaxial layer 210. Besides, the epitaxial layer 210 and the base substrate 200 will be referred to comprehensively as a semiconductor substrate 300. If step S32 is executed, the concentration of impurities in the semiconductor substrate 300 is distributed as shown in FIG. 33. As shown in the drawing, the concentration of n-type impurities in the epitaxial layer 210 is substantially constant.

Figure 34:
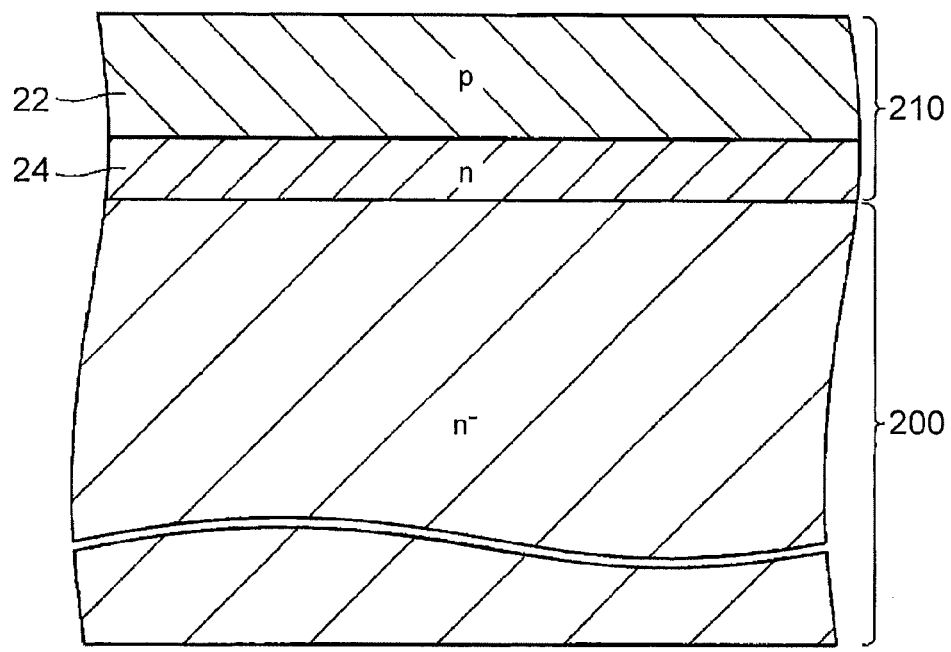
FIG. 34 is a longitudinal sectional view of the semiconductor substrate 300 after the execution of step S34.

In step S34, as shown in FIG. 34, the top body regions 22 are formed in the epitaxial layer 210. In this case, p-type impurities are ion-implanted into an upper face of the epitaxial layer 210 under a condition similar to that of the aforementioned step S4. That is, p-type impurities are implanted such that the average stop position of the implanted p-type impurities is in a region in the vicinity of the upper face of the epitaxial layer 210 (within a depth range where the emitter regions 20 are to be formed later). Subsequently, the semiconductor substrate 300 is subjected to a heat treatment under a condition similar to that of the aforementioned step S4, and the implanted p-type impurities are diffused and activated. Thus, the top body regions 22 are formed in the epitaxial layer 210. In this case, the top body regions 22 are formed such that the n-type epitaxial layer 210 remains below the top body regions 22. The n-type epitaxial layer 210 that is located below each of the top body regions 22 becomes a corresponding one of the floating regions 24.

Figure 35:
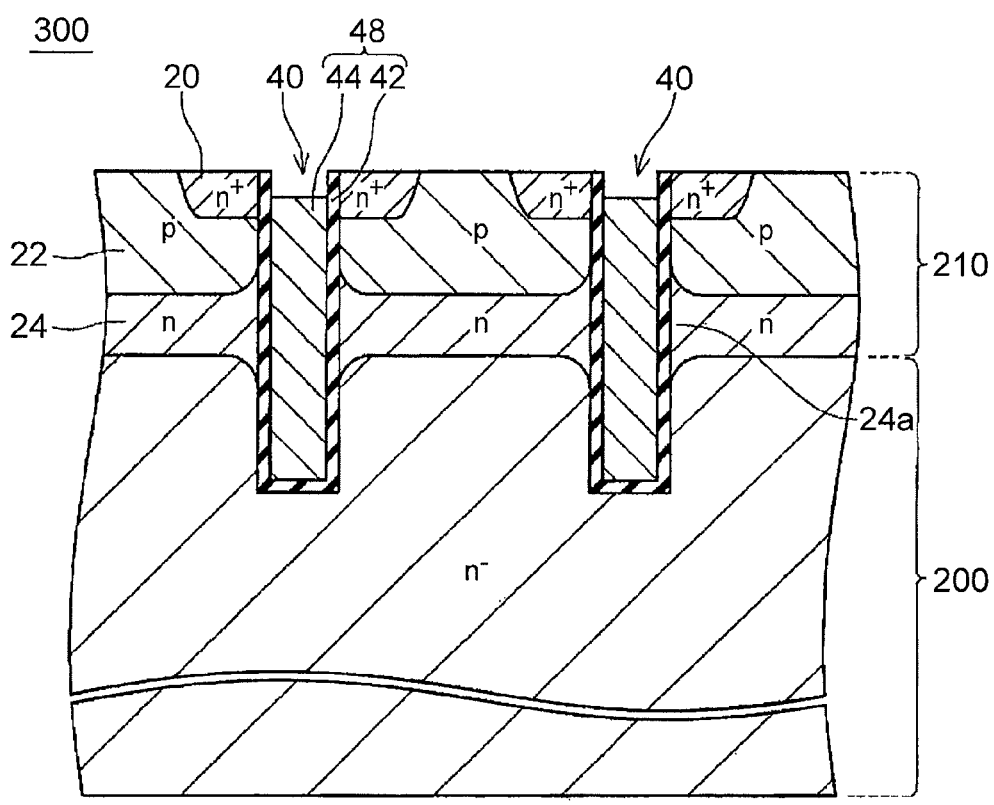
FIG. 35 is a longitudinal sectional view of the semiconductor substrate 300 after the execution of step S42.

In step S36, the emitter regions 20 are formed in the epitaxial layer 210 in the same manner as in the aforementioned step S6. In step S38, the trenches 40 that penetrate the emitter regions 20, the top body regions 22, and the floating regions 24 to reach the base substrate 200 are formed in an upper face of the semiconductor substrate 300. In step S40, the gate insulating films 42 are formed in the same manner as in the aforementioned step S10. At this time, the wide portions 24a are formed in the floating regions 24 in the vicinity of the gate insulating films 42, respectively. In step S42, the gate electrodes 44 are formed in the same manner as in the aforementioned step S12. After step S42 is executed, the semiconductor substrate 300 assumes a state shown in FIG. 35.

Figure 36:
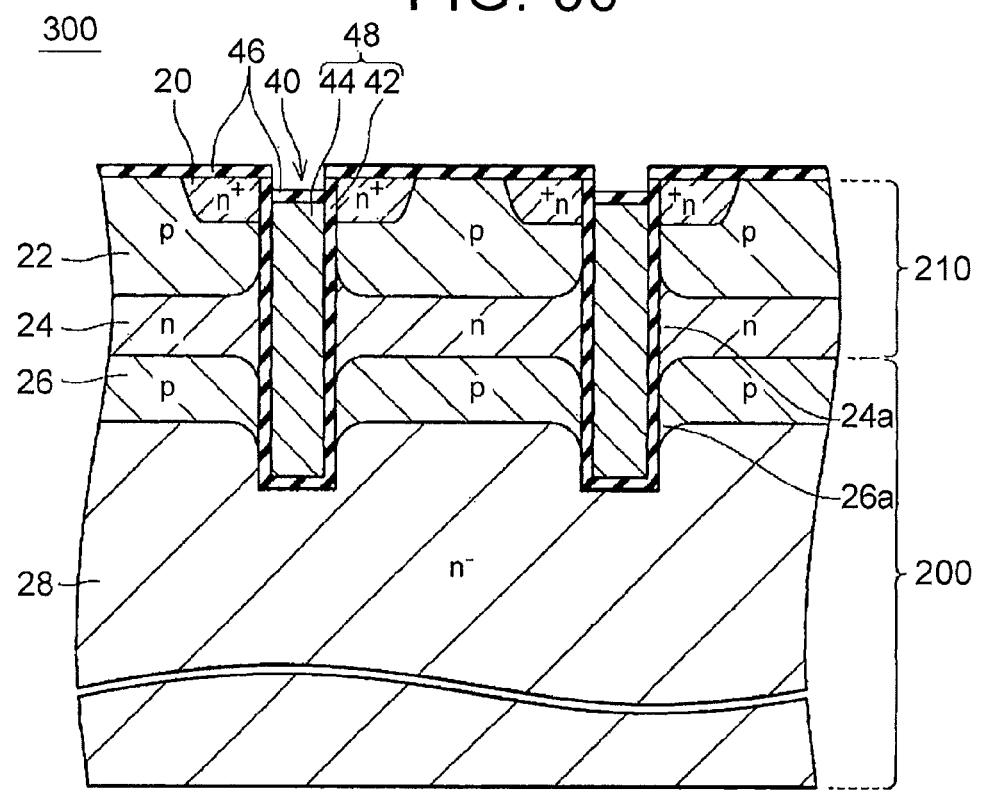
FIG. 36 is a longitudinal sectional view of the semiconductor substrate 300 after the execution of step S44.

In step S44, as shown in FIG. 36, the bottom body regions 26 are formed in those regions in the base substrate 200 which are in contact with the floating regions 24 respectively. In step S44, p-type impurities are implanted such that the average stop position of the implanted p-type impurities is located in the regions below the floating regions 24 (within the depth range of the bottom body regions 26 that should be formed) under a condition similar to that of the aforementioned step S14. Subsequently, the semiconductor substrate 300 is subjected to a heat treatment, and the p-type impurities are diffused and activated. Thus, as shown in FIG. 36, the bottom body regions 26 are formed. Incidentally, the displacement portions 26a are formed in the bottom body regions 26 respectively due to the influence of the bumps between the upper faces of the gate electrodes 44 and the upper face of the epitaxial layer 210.

Steps S45, S46 and S48 are carried out in the same manner as steps S15, S17 and S18 respectively. Thus, an IGBT that has a cross-sectional structure shown in FIG. 1 and the distribution of concentrations of impurities shown in FIG. 30 is completed.

In the IGBT according to the second embodiment of the invention, the following advantages are obtained in addition to the advantages obtained from the IGBT 10 according to the first embodiment of the invention. In the IGBT according to the second embodiment of the invention, the floating regions 24 are formed of the n-type epitaxial layer 210. In the case where the floating regions 24 are thus formed through epitaxial growth, the concentration of n-type impurities in the floating regions 24 can be made higher than in the case where the floating regions 24 are formed through diffusion as in the first embodiment of the invention. Thus, the floating regions 24 can be more stably formed, and the dispersion of the ON-state voltage among the IGBT's can further be reduced when the IGBT's are mass-produced.

Besides, in the IGBT according to the second embodiment of the invention, as shown in FIG. 30, the concentration of n-type impurities in the floating regions 24 is substantially constant. In this manner as well, the dispersion of the ON-state voltage is reduced. That is, in the IGBT 10 according to the first embodiment of the invention, as shown in FIG. 3, a maximum value $N_{FH}$ of the concentration of n-type impurities in the floating regions 24 exists at borders between the top body regions 22 and the floating regions 24 respectively. If the concentration of p-type impurities in the vicinity of the borders changes, the maximum value $N_{FH}$ also changes. The maximum value $N_{FH}$ has an influence on the ON-state voltage of the IGBT. Thus, in the IGBT 10 according to the first embodiment of the invention, the concentration of p-type impurities in the vicinity of the borders constitutes a factor that determines the ON-state voltage of the IGBT 10. On the other hand, in the IGBT according to the second embodiment of the invention, the concentration of n-type impurities in the floating regions 24 is substantially constant. Therefore, even if the concentration of p-type impurities in the vicinity of the borders changes, the maximum value of the concentration of n-type impurities in the floating regions 24 does not change. In this manner, in the IGBT according to the second embodiment of the invention, the number of factors determining the ON-state voltage has been reduced. Therefore, the ON-state voltage is more unlikely to be dispersed among the IGBT's when the IGBT's are mass-produced.

Figure 37:
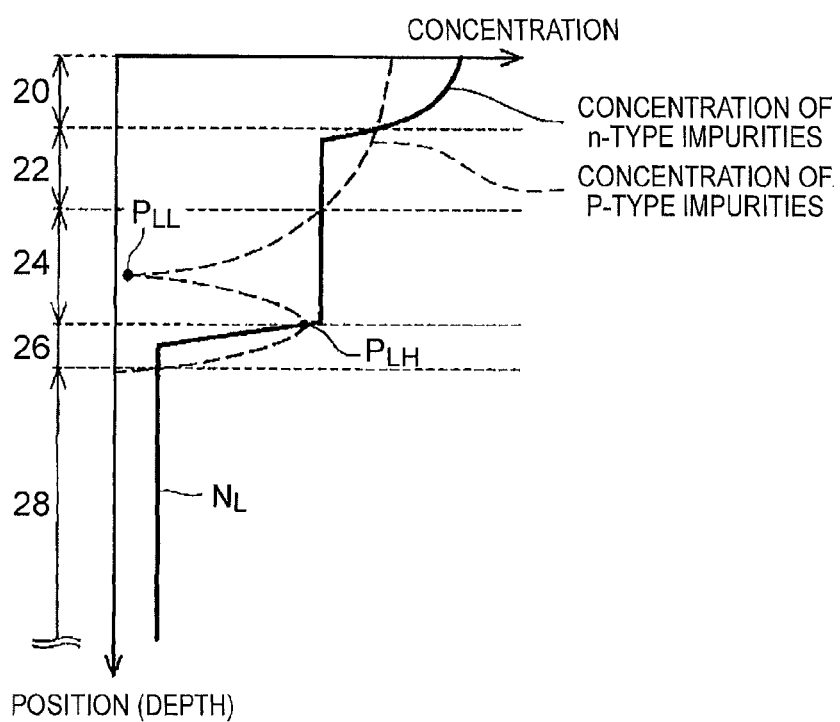
FIG. 37 is a graph of the distribution of concentrations of impurities in the IGBT according to the eighth modification example at a spot corresponding to FIG. 30.
Figure 38:
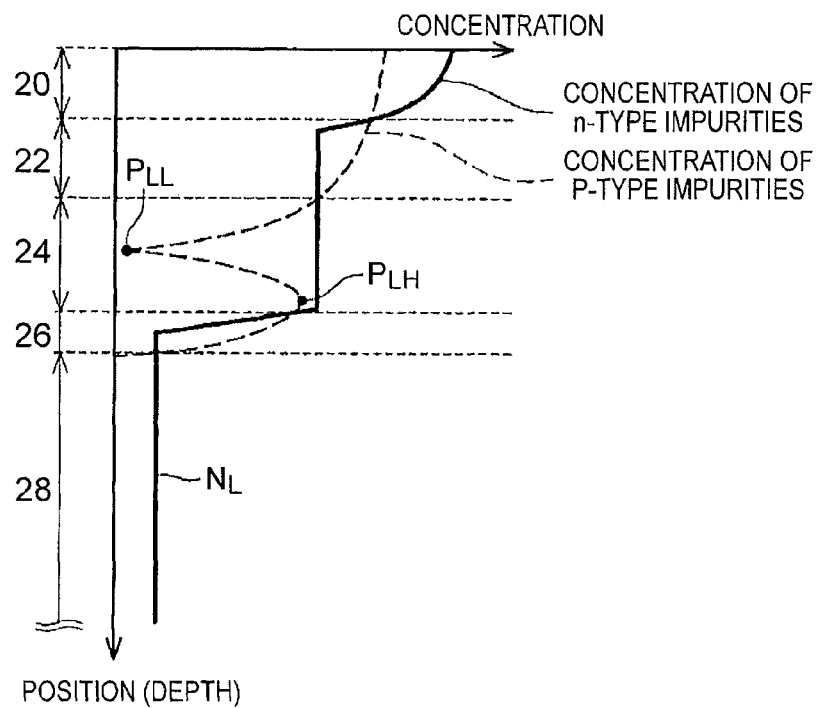
FIG. 38 is a graph of the distribution of concentrations of impurities in an IGBT according to a ninth modification example at the spot corresponding to FIG. 30.
Figure 39:
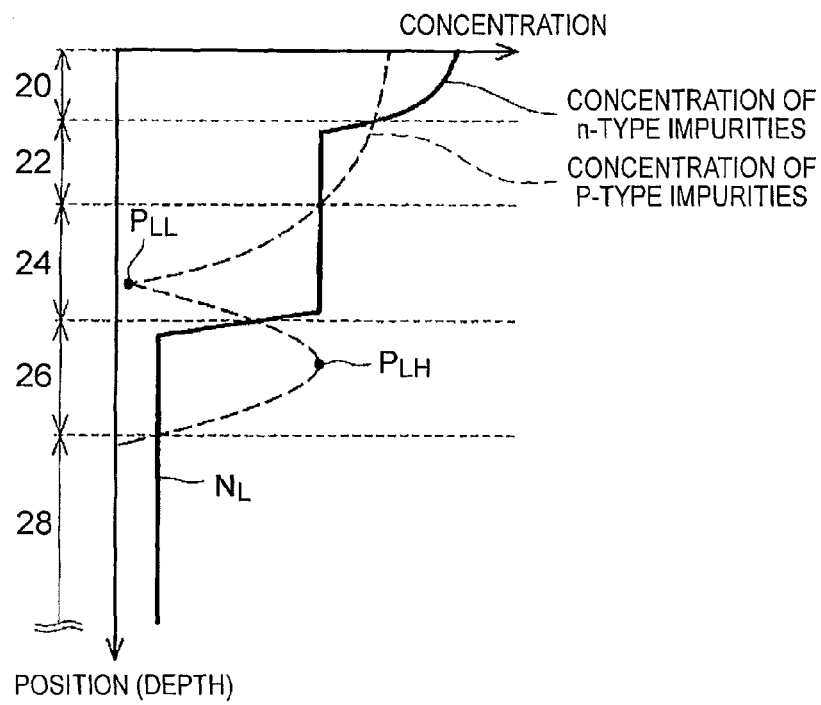
FIG. 39 is a graph of the distribution of concentrations of impurities in an IGBT according to a tenth modification example at the spot corresponding to FIG. 30.
Figure 40:
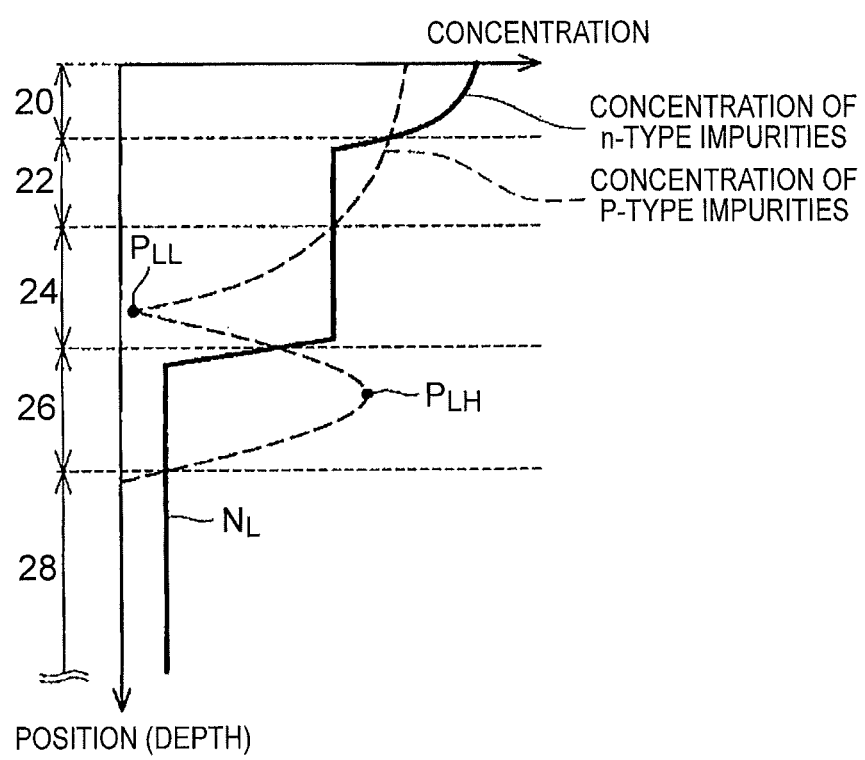
FIG. 40 is a graph of the distribution of concentrations of impurities in an IGBT according to an eleventh modification example at the spot corresponding to FIG. 30.

Incidentally, in the second embodiment of the invention, the local maximum value $P_{LH}$ of the concentration of p-type impurities is in the bottom body regions 26. However, as shown in FIG. 37, the local maximum value $P_{LH}$ may exist on the borders between the floating regions 24 and the bottom body regions 26 respectively, or as shown in FIG. 38, the local maximum value $P_{LH}$ may exist in the floating regions 24. Besides, in the second embodiment of the invention, the local maximum value $P_{LH}$ is lower than the concentration of n-type impurities in the floating regions 24. However, as shown in FIG. 39, the local maximum value $P_{LH}$ may be approximately equal to the concentration of n-type impurities in the floating regions 24, or as shown in FIG. 40, the local maximum value $P_{LH}$ may be higher than the concentration of n-type impurities in the floating regions 24. Besides, in the IGBT according to the second embodiment of the invention as well, the concentrations of impurities may be distributed as described above as to FIGS. 24 to 28.

Besides, in the IGBT according to the second embodiment of the invention as well, the respective regions may be arranged as shown in FIGS. 22 and 23.

Besides, although the IGBT that is formed on the semiconductor substrate has been described in each of the first embodiment of the invention and the second embodiment of the invention, another semiconductor element may further be formed on the semiconductor substrate. For example, in addition to the IGBT, a diode whose direction of electric conduction is reverse to that of the IGBT may be formed on the semiconductor substrate.

Besides, although the heat treatment for diffusing impurities to the top body regions and the heat treatment for diffusing impurities to the floating regions are individually performed in each of the first embodiment of the invention and the second embodiment of the invention, the diffusion of impurities to the floating regions and the diffusion of impurities to the top body regions may be realized through a single heat treatment.

The embodiments of the invention have been described above in detail. However, these embodiments of the invention are nothing more than exemplifications, and do not limit the claims. The art set forth in the claims encompasses various modifications and alterations of the concrete examples exemplified above.

The technical elements illustrated in the present specification or the drawings exert technical usefulness alone or in various combinations, and are not limited to the combinations described in the claims at the time of the filing of the application. Besides, the art exemplified in the present specification or the drawings achieves a plurality of objects at the same time, and has technical usefulness by achieving one of those objects itself.

The invention claimed is:

1. A method of manufacturing an IGBT, comprising:
    forming an n-type emitter region in a range to be exposed to an upper face of a semiconductor substrate, the emitter region having a depth;
    forming a p-type top body region below the depth of the emitter region by implanting p-type impurities into the upper face of the semiconductor substrate such that the p-type impurities stop within the depth of the emitter region, and diffusing the implanted p-type impurities, the top body region having a depth;
    forming an n-type floating region below the depth of the top body region by implanting n-type impurities into the upper face of the semiconductor substrate such that the n-type impurities stop within the depth of the emitter region, and diffusing the implanted n-type impurities, the floating region having a depth;
    forming a trench in the upper face of the semiconductor substrate, and forming a gate insulating film that covers an inner face of the trench, and a gate electrode that is arranged in the trench; and forming a p-type bottom body region below the depth of the floating region by implanting p-type impurities into the upper face of the semiconductor substrate such that the p-type impurities stop at a depth below the floating region, after forming the trench, the gate insulating film, and the gate electrode, wherein in the forming of the trench, the trench is arranged so that, after the respective formings are carried out, the trench penetrates the emitter region, the top body region, the floating region, and the bottom body region, and when a distribution of a concentration of p-type impurities in the top body region and the floating region, which are located below the emitter region, is viewed along a thickness direction of the semiconductor substrate, the concentration of the p-type impurities decreases as a downward distance increases from an upper end of the top body region that is located below the emitter region, and reaches a local minimum value at a predetermined depth in the floating region.

2. The manufacturing method according to claim 1, wherein the forming of the top body region and the forming of the floating region are carried out prior to of forming of the trench, the gate insulating film, and the gate electrode.

3. The manufacturing method according to claim 1, wherein the p-type impurities are implanted into the semiconductor substrate with an upper face of the gate electrode present below the upper face of the semiconductor substrate, in the forming of the bottom body region.

4. A method of manufacturing an IGBT, comprising:
causing an epitaxial layer of an n-type semiconductor to grow on an upper face of a base substrate;
forming an n-type emitter region in a range to be exposed to an upper face of the epitaxial layer;
forming a p-type top body region below a depth of the emitter region by implanting p-type impurities into the upper face of the epitaxial layer such that the p-type impurities stop within the depth of the emitter region, and diffusing the implanted p-type impurities;
forming a trench in the upper face of the epitaxial layer, and forming a gate insulating film that covers an inner face of the trench, and a gate electrode that is arranged in the trench; and
forming a p-type bottom body region in the base substrate by implanting p-type impurities into the upper face of the epitaxial layer such that the p-type impurities stop in the base substrate, after forming the trench, the gate insulating film, and the gate electrode, wherein the n-type epitaxial layer remains between the top body region and the bottom body region to constitute a floating region, and the trench is arranged to penetrate the emitter region, the top body region, the floating region, and the bottom body region, after the causing and the respective formings are carried out, and when a distribution of a concentration of p-type impurities in the top body region and the floating region, which are located below the emitter region, is viewed along a thickness direction of the semiconductor substrate, the concentration of the p-type impurities decreases as a downward distance increases from an upper end of the top body region that is located below the emitter region, and reaches a local minimum value at a predetermined depth in the floating region.

5. The manufacturing method according to claim 4, wherein the forming of the top body region is carried out prior to the forming of the trench, the gate insulating film, and the gate electrode.

6. The manufacturing method according to claim 4, wherein the p-type impurities are implanted into a semiconductor substrate with an upper face of the gate electrode present below an upper face of the semiconductor substrate, in the forming of the bottom body region.

* * * * *